United States Patent
Otsubo et al.

(10) Patent No.: US 11,462,644 B2
(45) Date of Patent: Oct. 4, 2022

(54) TFT MODULE, SCANNED ANTENNA PROVIDED WITH TFT MODULE, METHOD FOR DRIVING DEVICE PROVIDED WITH TFT MODULE, AND METHOD FOR PRODUCING DEVICE PROVIDED WITH TFT MODULE

(71) Applicant: Sharp Kabushiki Kaisha, Osaka (JP)

(72) Inventors: Masashi Otsubo, Sakai (JP); Akio Takahashi, Sakai (JP); Akinori Kubota, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 351 days.

(21) Appl. No.: 16/637,409

(22) PCT Filed: Aug. 2, 2018

(86) PCT No.: PCT/JP2018/029115
§ 371 (c)(1),
(2) Date: Feb. 7, 2020

(87) PCT Pub. No.: WO2019/031395
PCT Pub. Date: Feb. 14, 2019

(65) Prior Publication Data
US 2020/0168746 A1    May 28, 2020

(30) Foreign Application Priority Data
Aug. 10, 2017 (JP) .............................. JP2017-155144

(51) Int. Cl.
*G09G 3/30* (2006.01)
*H01L 29/786* (2006.01)
(Continued)

(52) U.S. Cl.
CPC ..... *H01L 29/78645* (2013.01); *G09G 3/3674* (2013.01); *H01L 27/124* (2013.01);
(Continued)

(58) Field of Classification Search
CPC .. G01L 29/78645; G09G 3/36; G09G 3/3674; G09G 5/00; G09G 3/30; H01L 27/124;
(Continued)

(56) References Cited

U.S. PATENT DOCUMENTS 7,466,269 B2   12/2008   Haziza
7,847,894 B2   12/2010   Rho
(Continued)

FOREIGN PATENT DOCUMENTS

JP    07-46515 A       2/1995
JP    2002-217640 A    8/2002
(Continued)

OTHER PUBLICATIONS

Official Communication issued in International Patent Application No. PCT/JP2018/029115, dated Oct. 30, 2018.
(Continued)

*Primary Examiner* — Pegeman Karimi
(74) *Attorney, Agent, or Firm* — Keating & Bennett, LLP

(57) ABSTRACT

A TFT module includes TFTs; gate bus lines; a plurality of source bus lines; unit electrodes connected with the source bus lines via the TFTs; a gate driver configured to supply a scan signal from a first end of the gate bus lines and a source driver configured to supply a data signal from a first end of the source bus lines, the gate driver and the source driver being provided in a second region lying around a first region in which the unit electrodes are provided; current sensing circuits provided in the second region; and feedback lines. Each of the feedback lines is connected with a corresponding current sensing circuit and with a second end of a
(Continued)

corresponding source bus line or gate bus line, the second end being opposite to the first end.

20 Claims, 16 Drawing Sheets

(51) Int. Cl.
*G09G 3/36* (2006.01)
*H01L 27/12* (2006.01)
*H01Q 3/44* (2006.01)
*H01Q 13/22* (2006.01)

(52) U.S. Cl.
CPC ......... *H01L 29/78603* (2013.01); *H01Q 3/44* (2013.01); *H01Q 13/22* (2013.01)

(58) Field of Classification Search
CPC .... H01L 29/78603; H01Q 3/44; H01Q 13/22; G06F 3/038
See application file for complete search history.

(56) References Cited

U.S. PATENT DOCUMENTS

| | | | | |
|---|---|---|---|---|
| 8,730,228 B2* | 5/2014 | Yonemaru | ............ | H05B 45/385 345/212 |
| 9,024,849 B2* | 5/2015 | Kawano | ............... | G09G 3/3233 345/80 |
| 10,522,085 B2* | 12/2019 | Jeong | ................... | G09G 3/3618 |
| 2011/0018142 A1* | 1/2011 | Kawamura | ........... | G02F 1/1345 257/776 |
| 2012/0092577 A1 | 4/2012 | Shi et al. | | |
| 2012/0194399 A1 | 8/2012 | Bily et al. | | |
| 2015/0015820 A1 | 1/2015 | Masutani et al. | | |
| 2017/0039953 A1* | 2/2017 | Lee | ....................... | G09G 3/3233 |
| 2017/0294159 A1* | 10/2017 | Lee | ....................... | G09G 3/3233 |
| 2018/0337446 A1 | 11/2018 | Nakazawa et al. | | |

FOREIGN PATENT DOCUMENTS

| | | |
|---|---|---|
| JP | 2005-227505 A | 8/2005 |
| JP | 2007-116573 A | 5/2007 |
| JP | 2007-295044 A | 11/2007 |
| JP | 2009-538565 A | 11/2009 |
| JP | 2013-539949 A | 10/2013 |
| JP | 2015-018144 A | 1/2015 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |

OTHER PUBLICATIONS

Stevenson et al., "Rethinking Wireless Communications: Advanced Antenna Design using LCD Technology", SID 2015 DIGEST, 55.2, 2015, pp. 827-830.

Ando et al., "A Radial Line Slot Antenna for 12 GHz Satellite TV Reception", IEEE Transactions on Antennas and Propagation, vol. AP-33, No. 12, Dec. 1985, pp. 1347-1353.

Nakazawa et al., "TFT Substrate, Scanning Antenna Using Same, and Method for Manufacturing TFT Substrate", U.S. Appl. No. 15/542,488, filed Jul. 10, 2017.

* cited by examiner

FIG.2
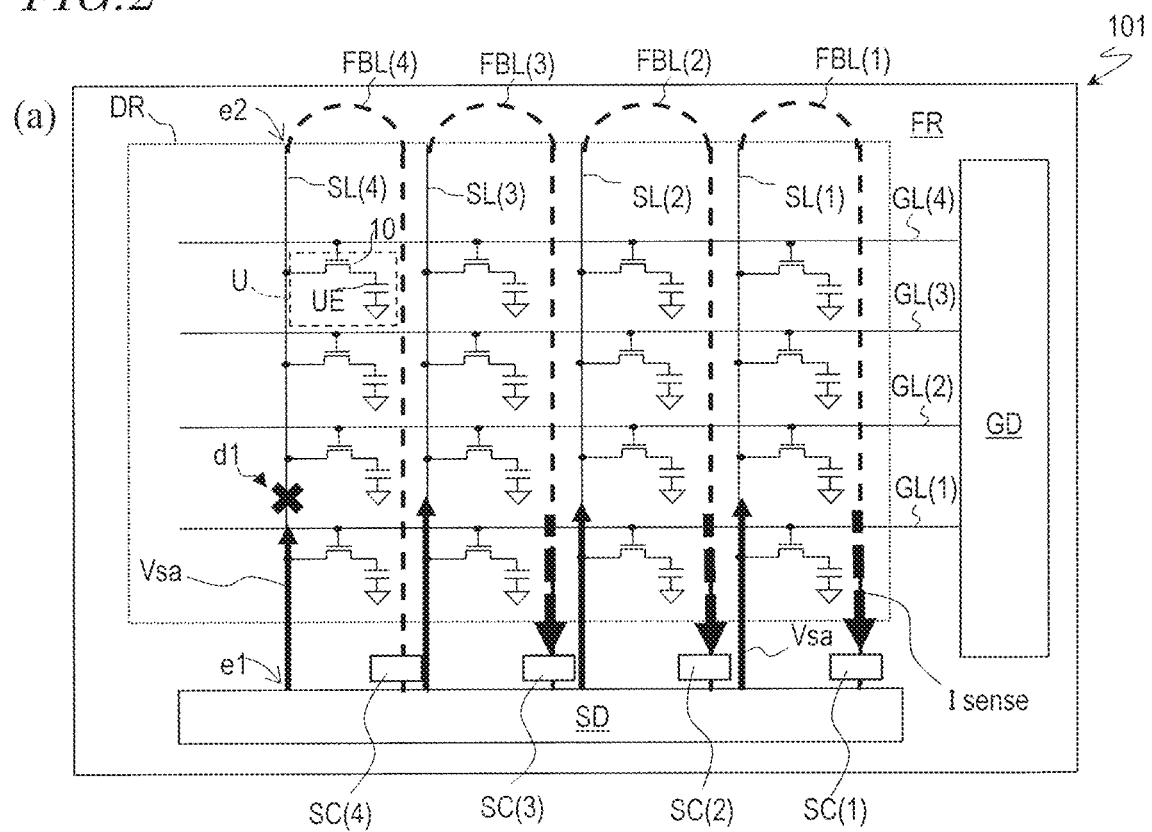
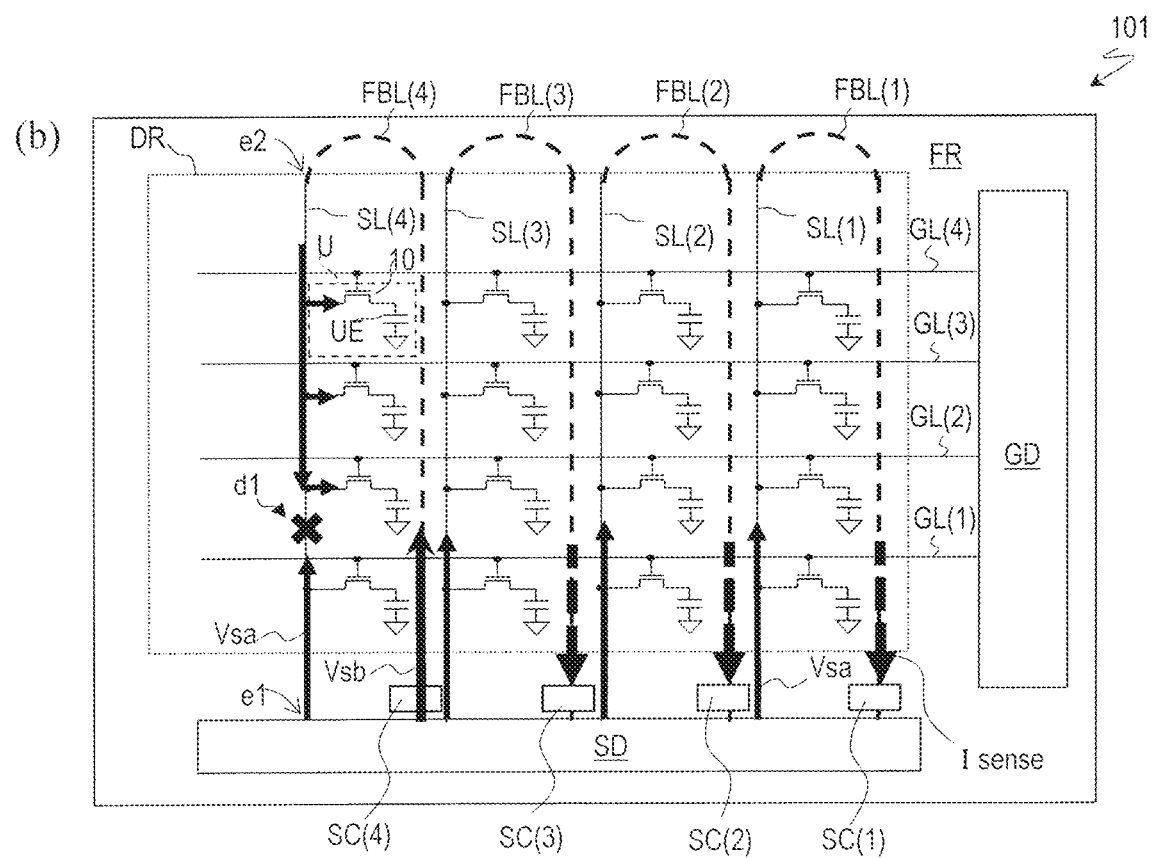

FIG.4
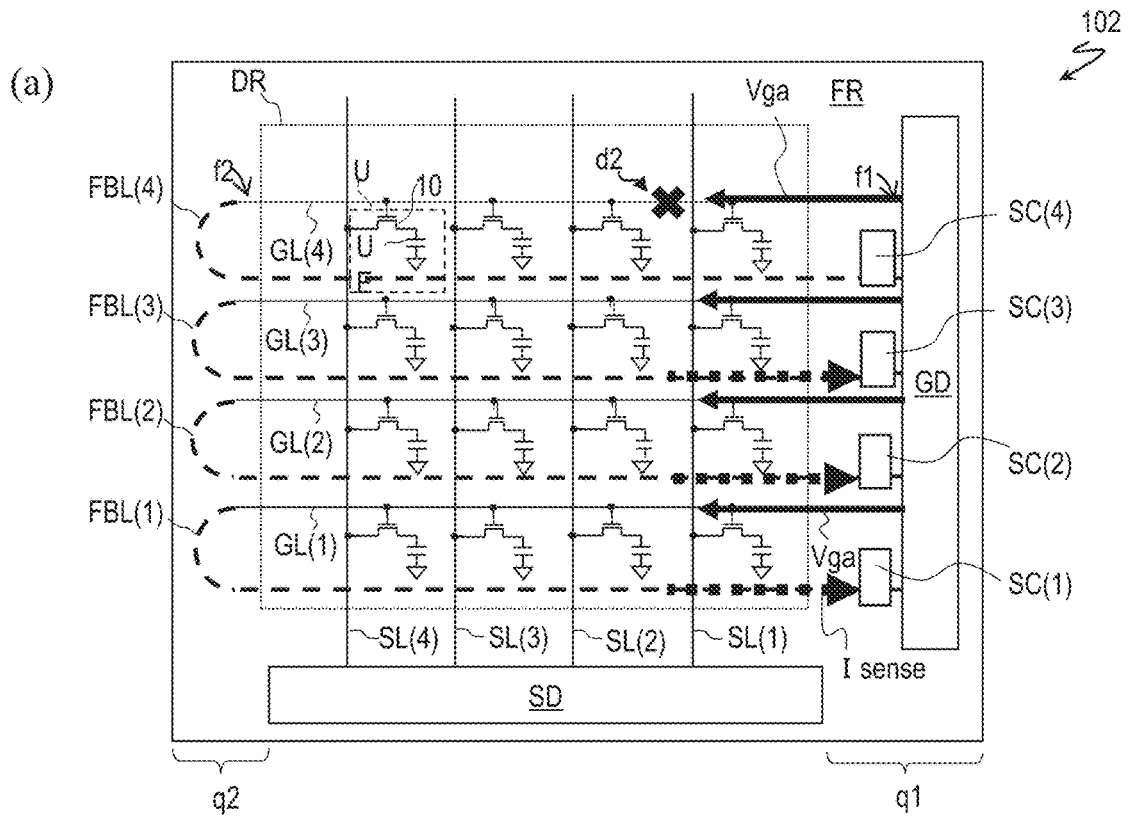
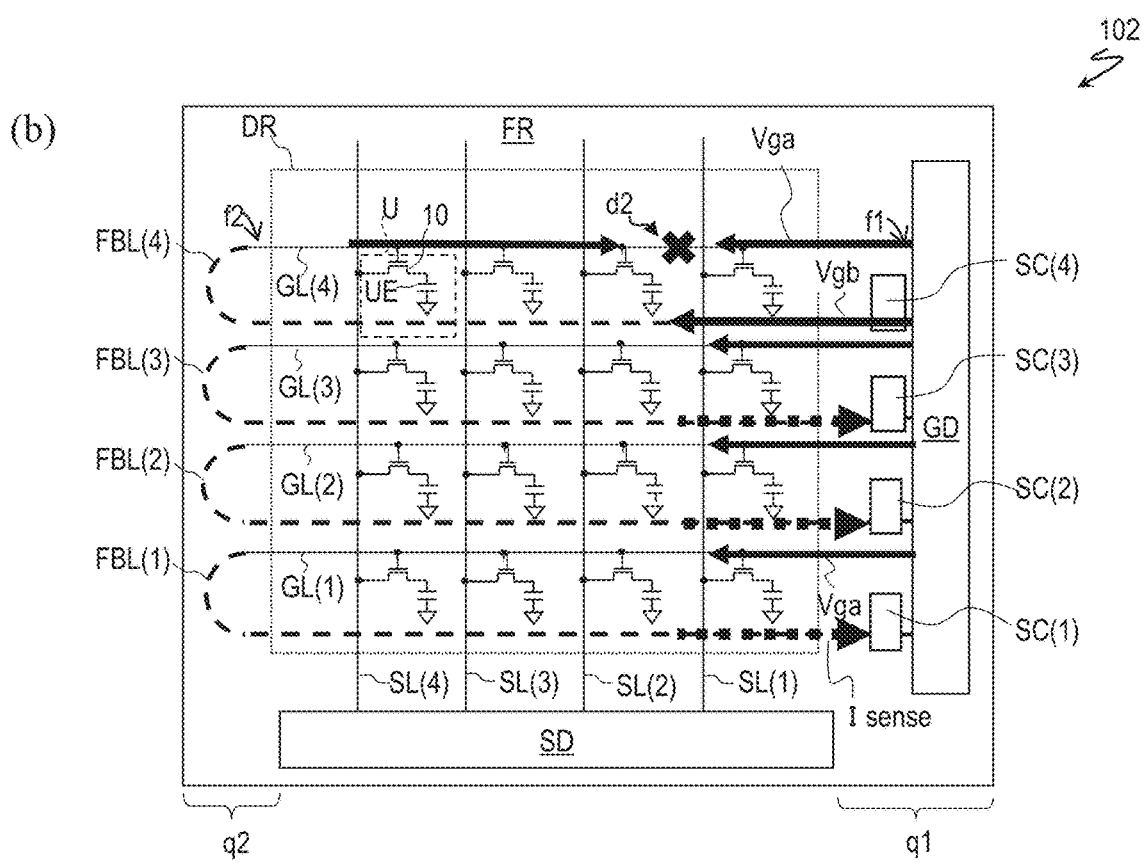

FIG.5
(a)
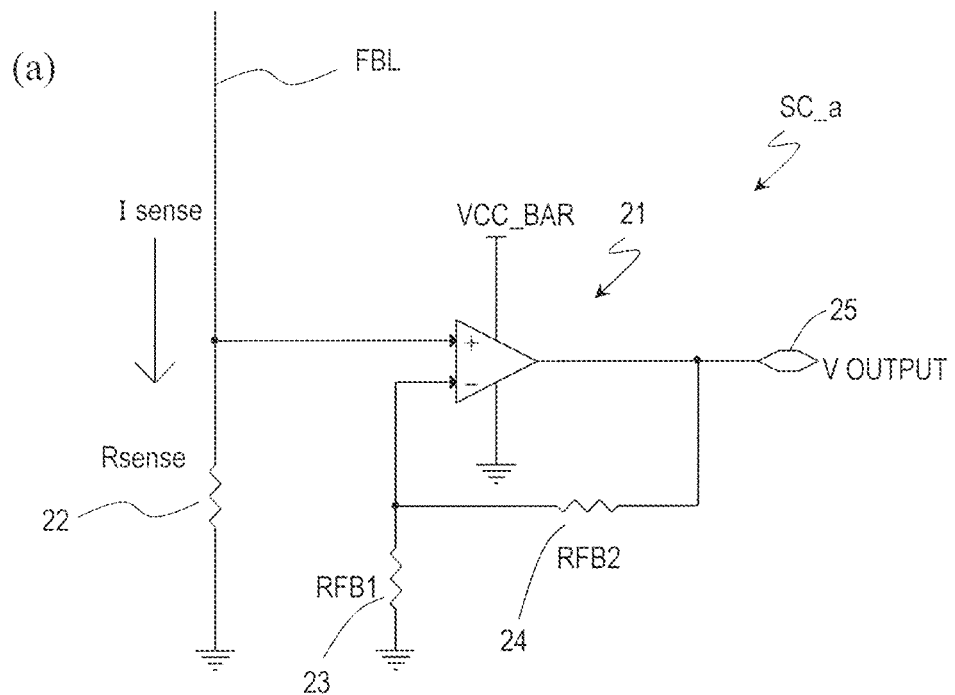
(b)
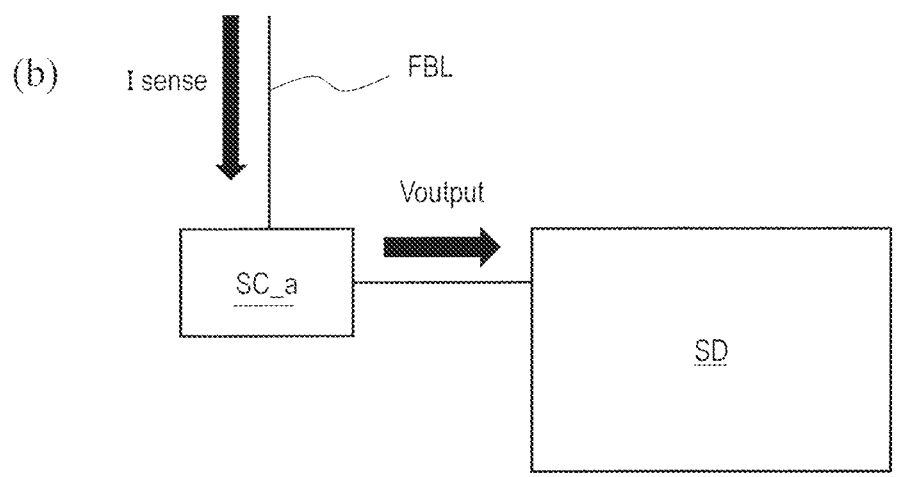

FIG. 7
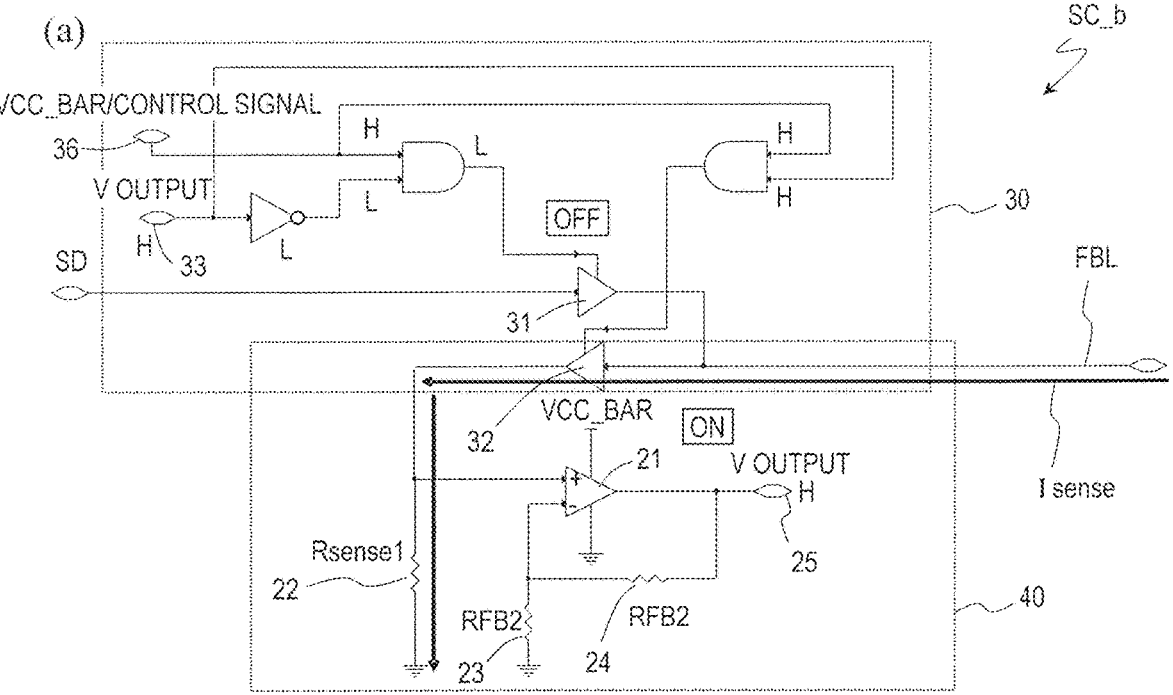
(a)
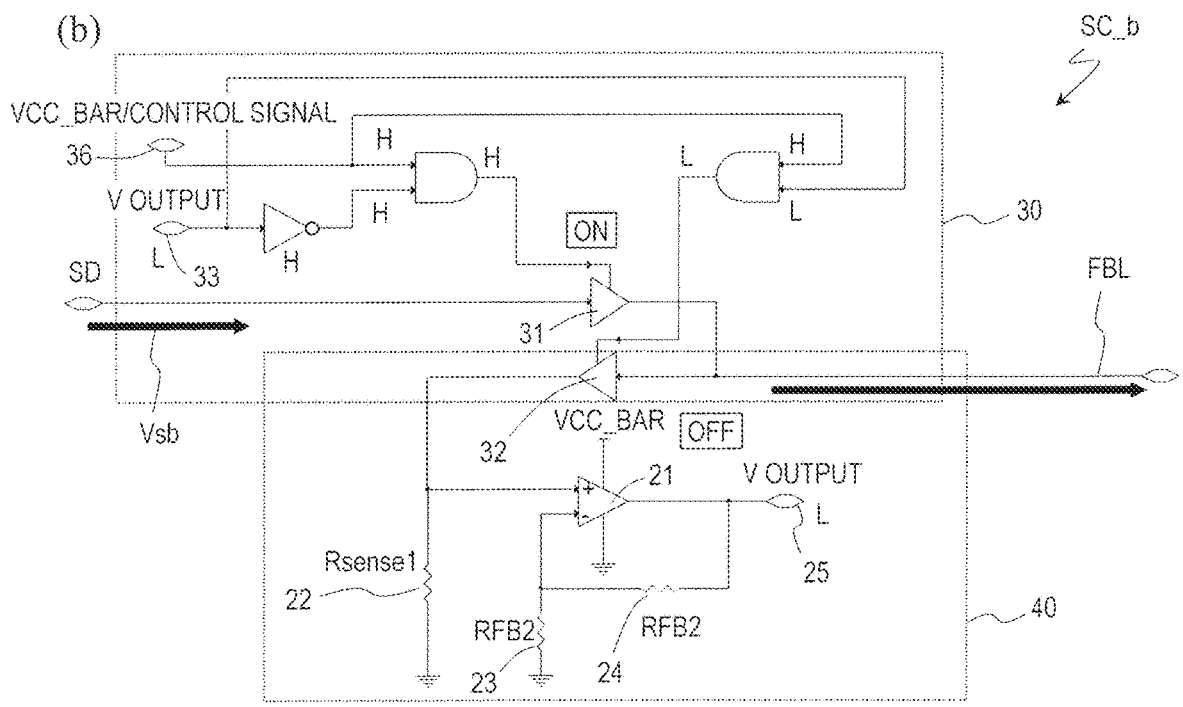
(b)

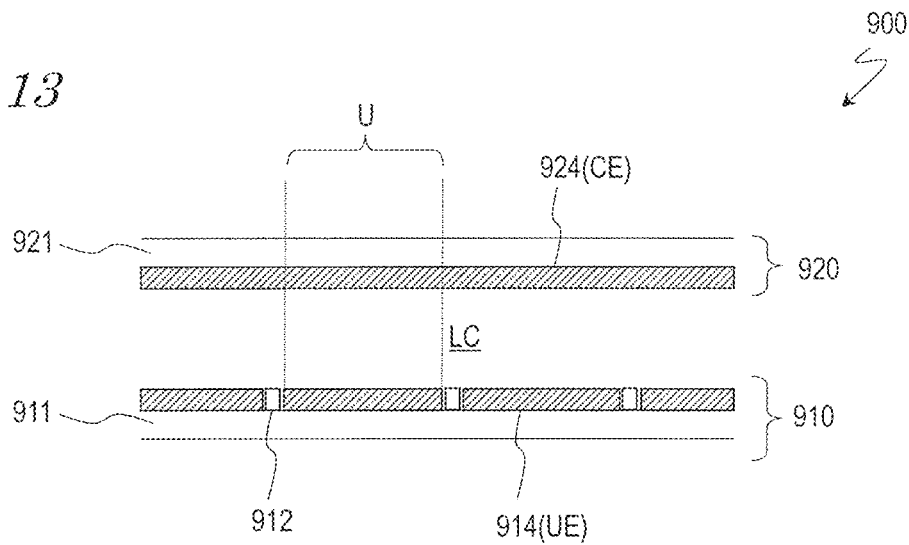
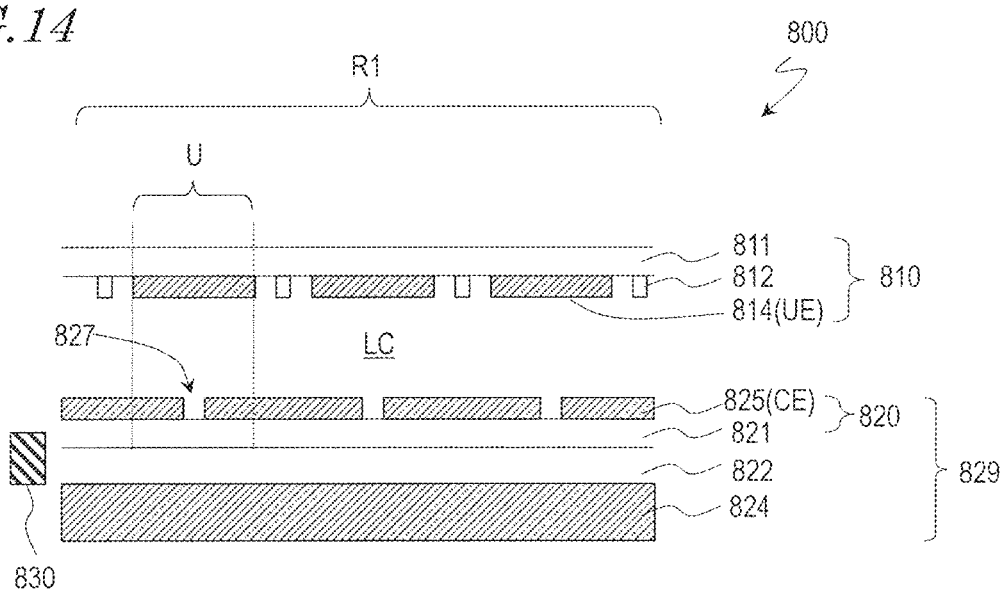

FIG.15
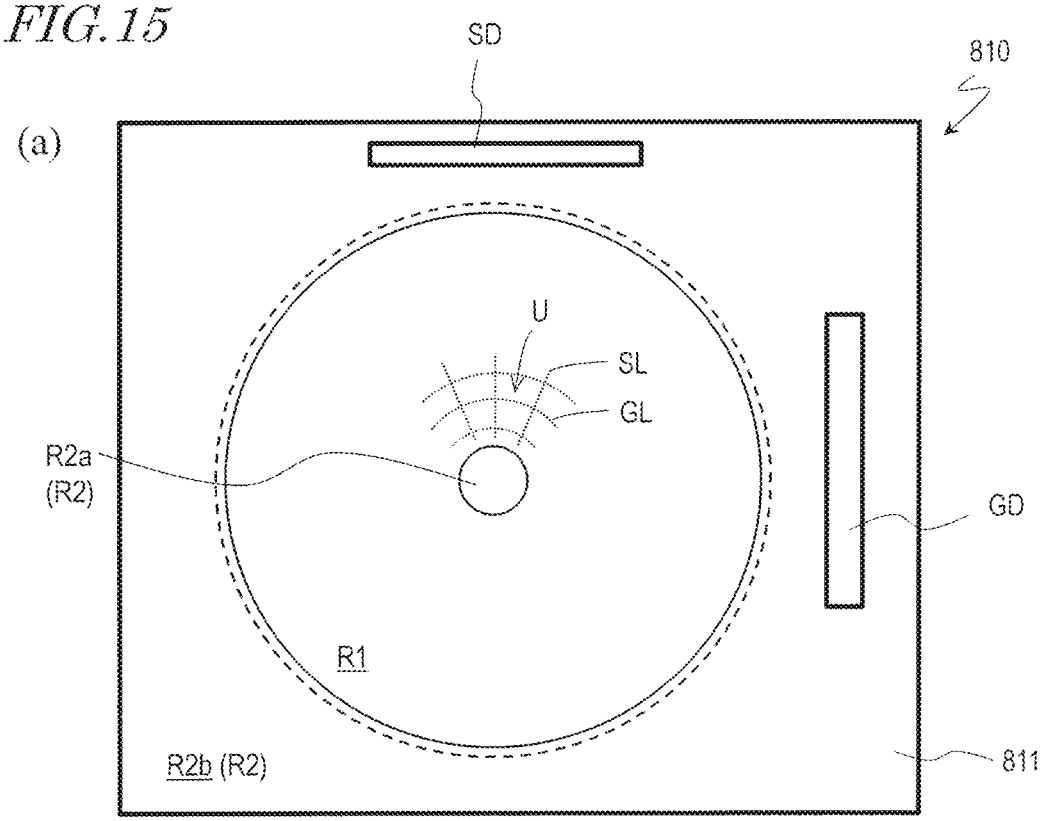
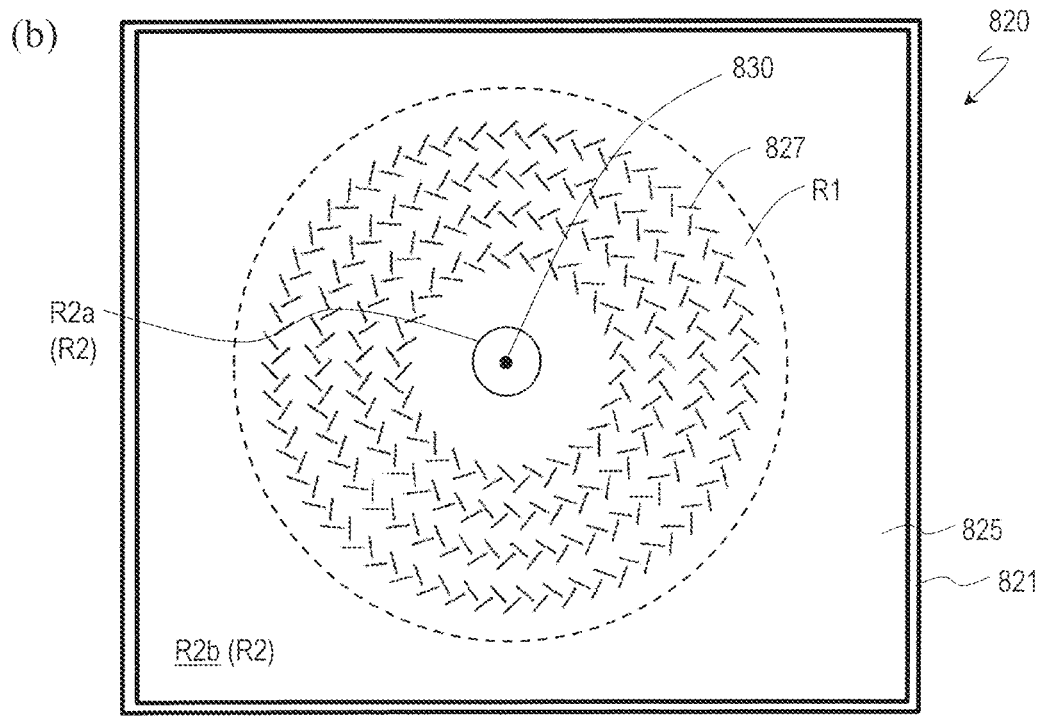

TFT MODULE, SCANNED ANTENNA PROVIDED WITH TFT MODULE, METHOD FOR DRIVING DEVICE PROVIDED WITH TFT MODULE, AND METHOD FOR PRODUCING DEVICE PROVIDED WITH TFT MODULE

TECHNICAL FIELD

The present invention relates to a TFT module and a scanned antenna which includes a TFT module, and particularly to a scanned antenna (also referred to as "liquid crystal array antenna") in which an antenna unit (also referred to as "device antenna") has liquid crystal capacitance. Also, the present invention relates to a manufacturing method and a driving method of a device which includes a TFT module.

BACKGROUND ART

TFT substrates are used in, for example, display devices such as liquid crystal display devices, memory devices such as DRAM, etc. In these devices, peripheral circuits such as drivers and inspection circuits are mounted to a TFT substrate. In some cases, the entirety or a part of the peripheral circuits is monolithically (integrally) formed in the TFT substrate. In this specification, a module which includes a TFT substrate is referred to as "TFT module". The "TFT module" refers not only to a module in which peripheral circuits are provided on a TFT substrate but also to a TFT substrate.

A TFT module includes a plurality of unit regions which are two-dimensionally arrayed. Each unit region includes a thin film transistor (hereinafter, "TFT") as a switching element. When the TFT module is used in a display device, the unit regions of the TFT module are referred to as "pixel regions". The pixel regions are regions corresponding to the pixels of the display device.

The TFT module can also be used in a scanned antenna, particularly in a phased array antenna which includes a plurality of antenna units. In this specification, the "scanned antenna" refers to an antenna which is capable of changing the direction of the beam (referred to as "beam scanning" or "beam steering"). When the TFT module is used in a scanned antenna, the unit regions of the TFT module are regions corresponding to the antenna units of the scanned antenna.

Patent Documents Nos. 1-5 and Non-patent Document 1 propose scanned antennas which utilize large dielectric anisotropy (birefringence) of a liquid crystal material (including nematic liquid crystal and polymer dispersed liquid crystal).

Patent Document No. 6 of the present applicant discloses a scanned antenna which can be mass-produced using conventional LCD manufacturing techniques, a TFT module for use in such a scanned antenna, and a manufacturing method and a driving method of such a scanned antenna. The disclosure of Patent Document No. 6 is incorporated herein by reference in its entirety.

CITATION LIST

Patent Literature

Patent Document No. 1: Japanese Laid-Open Patent Publication No. 2007-116573

Patent Document No. 2: Japanese Laid-Open Patent Publication No. 2007-295044

Patent Document No. 3: Japanese PCT National Phase Laid-Open Publication No. 2009-538565

Patent Document No. 4: Japanese PCT National Phase Laid-Open Publication No. 2013-539949

Patent Document No. 5: WO 2015/126550

Patent Document No. 6: WO 2017/061527

Non-Patent Literature

Non-patent Document No. 1: R. A. Stevenson et al., "Rethinking Wireless Communications: Advanced Antenna Design using LCD Technology", SID 2015 DIGEST, pp. 827-830.

Non-patent Document No. 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY OF INVENTION

Technical Problem

In the manufacturing process of the TFT module, there is a probability that defects such as wire breakage, short circuit, etc., will occur in wires of gate bus lines, source bus lines, etc. When a display device, scanned antenna, or the like, is manufactured using a TFT module which has a defect, there is a probability that desired characteristics will not be attained.

In the display device, in an inspection step, the presence/absence of defects such as wire breakage, short circuit, etc., and the positions of the defects in the TFT module can be detected by visual perception or image analysis. However, as the size of the display device increases, it is sometimes difficult to detect defects in the TFT module by visual perception.

In the other devices than the display device, for example, DRAM, scanned antenna, etc., a metal electrode which is not transparent is sometimes used for electrodes which are for application of a voltage across the liquid crystal layer, and it is difficult to detect defects in the TFT module by visual perception.

One embodiment of the present invention was conceived in view of the above-described circumstances. An object of the present invention is to provide a TFT module in which it is possible to easily detect a wire breakage or short circuit and a scanned antenna which includes the TFT module. Another object of the present invention is to provide a manufacturing method and a driving method of a device which includes the TFT module.

Solution to Problem

A TFT module of one embodiment of the present invention includes: a substrate; a plurality of TFTs supported by the substrate; a plurality of gate bus lines, each of the plurality of TFTs being connected with any one of the plurality of gate bus lines; a plurality of source bus lines intersecting the plurality of gate bus lines; a plurality of unit electrodes each connected with a corresponding one of the plurality of source bus lines via a corresponding one of the plurality of TFTs; and a gate driver configured to supply a scan signal from a first end of the plurality of gate bus lines and a source driver configured to supply a data signal from a first end of the plurality of source bus lines, the gate driver and the source driver being provided in a second region lying around a first region in which the plurality of unit electrodes are provided, wherein the TFT module further includes a plurality of current sensing circuits provided in the second region, and a plurality of feedback lines, and each of the plurality of feedback lines is connected with a corresponding one of the plurality of current sensing circuits and with a second end of a corresponding one of the plurality of source bus lines or the plurality of gate bus lines, the second end being opposite to the first end.

In one embodiment, each of the plurality of current sensing circuits includes an input/output terminal which includes a bidirectional buffer, the input/output terminal being connected with a corresponding one of the plurality of feedback lines.

In one embodiment, each of the plurality of feedback lines is connected with the second end of a corresponding one of the plurality of source bus lines.

In one embodiment, each of the plurality of feedback lines is connected with the second end of a corresponding one of the plurality of gate bus lines.

In one embodiment, each of the plurality of current sensing circuits is connected with the source driver, and each of the plurality of current sensing circuits is configured such that the data signal is supplied from the source driver to a source bus line connected via a feedback line corresponding to that current sensing circuit and that, when no sense current flows through the corresponding feedback line, an auxiliary data signal from the source driver is output to the corresponding feedback line.

In one embodiment, each of the plurality of current sensing circuits is connected with the gate driver, and each of the plurality of current sensing circuits is configured such that the scan signal is supplied from the gate driver to a gate bus line connected via a feedback line corresponding to that current sensing circuit and that, when no sense current flows through the corresponding feedback line, an auxiliary data signal from the gate driver is output to the corresponding feedback line.

In one embodiment, the TFT module further includes a memory in which breakage detection information is stored, the breakage detection information specifying a feedback line connected with a source bus line or gate bus line in which a wire breakage is detected beforehand.

A TFT module of another embodiment of the present invention includes: a substrate; a plurality of TFTs supported by the substrate; a plurality of gate bus lines, each of the plurality of TFTs being connected with any one of the plurality of gate bus lines; a plurality of source bus lines intersecting the plurality of gate bus lines; and a plurality of unit electrodes each connected with a corresponding one of the plurality of source bus lines via a corresponding one of the plurality of TFTs, wherein in a second region lying around a first region in which the plurality of unit electrodes are provided, the plurality of gate bus lines have a first end to which a scan signal is supplied from a gate driver, and the plurality of source bus lines have a first end to which a data signal is supplied from a source driver, the TFT module further includes a plurality of inspection terminals provided in the second region, and a plurality of feedback lines, and each of the plurality of feedback lines is connected with a corresponding one of the plurality of inspection terminals and with a second end of a corresponding one of the plurality of source bus lines or the plurality of gate bus lines, the second end being opposite to the first end.

In one embodiment, each of the plurality of feedback lines extends across the first region.

In one embodiment, each of the plurality of feedback lines is provided only in the second region.

A TFT module of still another embodiment of the present invention includes: a substrate; a plurality of TFTs supported by the substrate; a plurality of gate bus lines, each of the plurality of TFTs being connected with any one of the plurality of gate bus lines; a plurality of source bus lines intersecting the plurality of gate bus lines; a plurality of unit electrodes each connected with a corresponding one of the plurality of source bus lines via a corresponding one of the plurality of TFTs; and a gate driver configured to supply a scan signal from a first end of the plurality of gate bus lines and a source driver configured to supply a data signal from a first end of the plurality of source bus lines, the gate driver and the source driver being provided in a second region lying around a first region in which the plurality of unit electrodes are provided, wherein the source driver has a plurality of output terminals, the plurality of output terminals including a plurality of first output terminals for outputting a first data signal of a first polarity and a plurality of second output terminals for outputting a second data signal of a second polarity, each of the plurality of first output terminals being arranged adjacent to any of the plurality of second output terminals, each of the plurality of source bus lines is electrically coupled with a corresponding one of the plurality of first output terminals, the TFT module further includes a plurality of current sensing circuits provided in the second region, and a plurality of sensing lines, and each of the plurality of sensing lines is connected with a corresponding one of the plurality of second output terminals and with a corresponding one of the plurality of current sensing circuits.

In one embodiment, the plurality of unit regions are concentrically arranged.

In one embodiment, the plurality of unit electrodes are metal electrodes.

A scanned antenna of one embodiment of the present invention includes: the TFT module as set forth in any of the foregoing paragraphs; a slot substrate arranged so as to oppose the substrate; a liquid crystal layer provided between the substrate and the slot substrate; and an electrically-conductive reflector arranged so as to oppose a surface of the slot substrate opposite to the liquid crystal layer via a dielectric layer, wherein the slot substrate includes a dielectric substrate and a slot electrode provided on a surface of the dielectric substrate on the liquid crystal layer side, and the slot electrode has a plurality of slots, the plurality of slots being arranged so as to correspond to the plurality of unit electrodes of the TFT module.

A device driving method of one embodiment of the present invention is a method for driving a device which includes the TFT module as set forth in the foregoing paragraph, the method including: in supplying the data signal from the source driver to each of the plurality of source bus lines, sensing a sense current flowing through each of the plurality of feedback lines, thereby detecting the presence/absence of a wire breakage in the plurality of source bus lines; and in supplying the data signal to a breakage-detected source bus line which is detected as having a wire breakage, supplying an auxiliary data signal to a feedback line connected with the breakage-detected source bus line.

A device driving method of another embodiment of the present invention is a method for driving a device which includes the TFT module as set forth in the foregoing paragraph, the method including: in supplying the scan signal from the gate driver to each of the plurality of gate bus lines, sensing a sense current flowing through each of the plurality of feedback lines, thereby detecting the presence/absence of a wire breakage in the plurality of gate bus lines; and in supplying the scan signal to a breakage-detected gate bus line which is detected as having a wire breakage, supplying an auxiliary scan signal to a feedback line connected with the breakage-detected gate bus line.

A device driving method of still another embodiment of the present invention is a method for driving a device which includes the TFT module as set forth in the foregoing paragraph, the method including: retrieving the breakage detection information from the memory; and in supplying the data signal or the scan signal to the source bus line or gate bus line in which a wire breakage is detected beforehand based on the breakage detection information, supplying an auxiliary data signal or auxiliary scan signal to a feedback line connected with the source bus line or gate bus line.

A device manufacturing method of one embodiment of the present invention is a method for manufacturing a device which includes the TFT module as set forth in any of the foregoing paragraphs, the method including: supplying a signal for inspection to each of the plurality of source bus lines or the plurality of gate bus lines and sensing an electric current in each of the plurality of feedback lines, thereby detecting the presence/absence of a wire breakage in the plurality of source bus lines or the plurality of gate bus lines; producing breakage detection information which specifies a feedback line connected with a source bus line or gate bus line which is detected as having a wire breakage; and storing the breakage detection information in a memory.

A device manufacturing method of another embodiment of the present invention is a method for manufacturing a device which includes the TFT module as set forth in the foregoing paragraph, the method including: supplying the first data signal from the source driver to the plurality of source bus lines and sensing an electric current in each of the plurality of sensing lines, thereby detecting the presence/absence of a short circuit between the plurality of sensing lines and the plurality of source bus lines; and if the presence of a short circuit is detected, producing a signal which specifies a sensing line in which the presence of a short circuit is detected.

In one embodiment, the device is a scanned antenna.

Advantageous Effects of Invention

According to an embodiment of the present invention, a TFT module in which it is possible to easily detect a wire breakage or short circuit and a scanned antenna which includes the TFT module are provided. Also, a manufacturing method and a driving method of a device which includes the TFT module are provided.

BRIEF DESCRIPTION OF DRAWINGS

FIG. 2(a) and FIG. 2(b) are plan views for illustrating a driving method of a device which includes the TFT module 101.

FIG. 4(a) and FIG. 4(b) are plan views for illustrating a driving method of a device which includes the TFT module 102.

FIG. 5(a) is a circuit diagram illustrating a current sensing circuit SC_a of the first embodiment. FIG. 5(b) is a diagram showing the relationship between the current sensing circuit SC_a and a source driver SD.

FIG. 7(a) and FIG. 7(b) are diagrams for illustrating the operation of the current sensing circuit SC_b.

FIG. 13 is a schematic cross-sectional view of a liquid crystal display device 900 which includes a TFT module of the first embodiment.

FIG. 14 is a schematic cross-sectional view of a scanned antenna 800 which includes a TFT module of the first embodiment.

FIG. 15(a) and FIG. 15(b) are schematic plan views respectively illustrating a TFT module 810 and a slot substrate 820 in the scanned antenna 800.

DESCRIPTION OF EMBODIMENTS (Basic Configuration and Drawbacks of Conventional TFT Module)

First, the basic configuration of a conventional TFT module is described with reference to the drawings.

Figure 18:
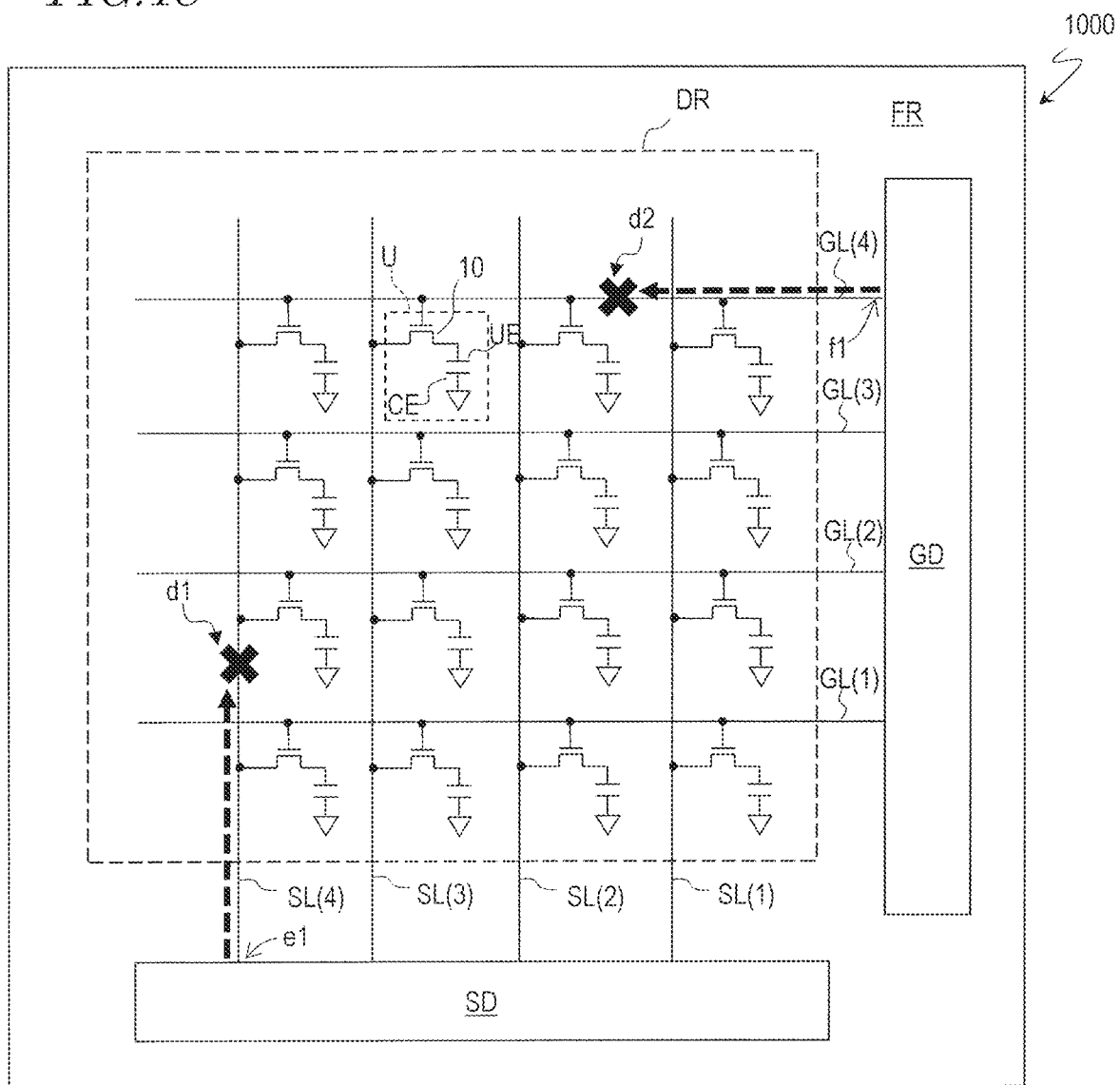
FIG. 18 is a schematic cross-sectional view of a conventional TFT module 1000.

FIG. 18 is an overview showing an example of the configuration of a TFT module 1000.

The TFT module 1000 includes the first region R1 consisting of a plurality of unit regions U and a second region (also referred to as "peripheral region" or "frame region") R2 which is exclusive of the first region R1. In the first region R1, the unit regions U are arrayed in a matrix. In this example, the unit regions U are arrayed in the row direction and the column direction, although they may be concentrically arranged.

In the first region R1, a plurality of gate bus lines GL extending in one direction (e.g., row direction) and a plurality of source bus lines SL extending in a direction intersecting the gate bus lines GL (e.g., column direction) are provided. FIG. 18 shows four of the plurality of gate bus lines GL, which are referred to as gate bus lines GL(1)-DL(4), and four of the plurality of source bus lines SL, which are referred to as source bus lines SL(1)-SL(4). Each of the unit regions U is defined by, for example, the gate bus lines GL and the source bus lines SL.

Each of the unit regions U includes a thin film transistor (TFT) 10 and a unit electrode UE. The unit electrode UE is connected with a corresponding one of the source bus lines SL via the TFT 10. The gate electrode of the TFT 10 is electrically coupled with a corresponding one of the gate bus lines GL. The source electrode of the TFT 10 is electrically coupled with a corresponding one of the source bus lines SL. The drain electrode of the TFT 10 is electrically coupled with the unit electrode UE.

When a liquid crystal display device or scanned antenna is manufactured using the TFT module 1000, a counter substrate (not shown) is provided so as to oppose the TFT module 1000 with the liquid crystal layer interposed therebetween. The counter substrate includes a counter electrode CE. The unit electrode UE, the counter electrode CE and the liquid crystal layer form a liquid crystal capacitance. These electrodes UE, CE are used for applying a predetermined voltage across the liquid crystal layer, whereby the liquid crystal alignment can be controlled in each of the unit regions U. Note that, alternatively, the counter electrode CE can be provided in the TFT module 1000.

In the second region R2, peripheral circuits such as gate driver (also referred to as "scan driver") GD, source driver (also referred to as "data driver") SD, unshown control circuits, etc., are provided. These circuits may be mounted or may be integrally (monolithically) formed with the TFT module 1000.

One ends (first ends) f1 of the gate bus lines GL are connected with respective terminals of the gate driver GD. The gate driver GD supplies scan signals from the first ends f1 of the gate bus lines GL for driving the TFTs 10 of the unit regions U.

One ends (first ends) e1 of the source bus lines SL are connected with respective terminals of the source driver SD. The source driver SD supplies data signals from the first ends e1 of the source bus lines SL. The data signals are supplied to respective ones of the unit electrodes UE via the TFTs 10.

The source driver SD and the gate driver GD are connected with an unshown control circuit. Scan signal and data signals are supplied from the gate driver GD and the source driver SD to the gate bus lines GL and the source bus lines SL, respectively, based on the signals supplied from the control circuit to the gate driver GD and the source driver SD.

The TFT module 1000 is broadly applicable to devices such as liquid crystal display devices, scanned antennas, etc. Driving of such devices is carried out based on, for example, a line sequential scanning system. The line sequential scanning will be described later. When the TFT module 1000 is applied to a liquid crystal display device, the unit regions U are also referred to as "pixel regions", the unit electrode UE is also referred to as "pixel electrode", the first region R1 is also referred to as "display region", and the second region R2 is also referred to as "non-display region". When the TFT module 1000 is applied to a scanned antenna, the unit regions U are also referred to as "antenna unit regions", the unit electrode UE is also referred to as "patch electrode", the counter electrode CE is also referred to as "slot electrode", the first region R1 is also referred to as "transmitting/receiving region", and the second region R2 is also referred to as "non-transmitting/receiving region". In the display device, the pixel electrode and the counter electrode are transparent electrodes and, in the liquid crystal antenna, the patch electrode and the slot electrode are usually metal electrodes.

In a device which includes the TFT module 1000, if the TFT module 1000 has a defect such as wire breakage, a plurality of unit regions U connected with source bus lines or gate bus lines which have a wire breakage are not concurrently driven so that a line defect can occur.

The device is described more specifically with reference to FIG. 18 with an example where the source bus line SL(4) has a wire breakage portion d1.

If the source bus line SL(4) has the wire breakage portion d1, the liquid crystal alignment is appropriately controlled in a unit region U which is connected between the wire breakage portion d1 and the first end e1 (the end connected with the source driver SD) in the source bus line SL(4). However, a predetermined data signal is not supplied to unit regions U which are connected on the downstream side of the wire breakage portion d1 in the source bus line SL(4). Therefore, the liquid crystal alignment is not appropriately controlled so that a line defect occurs.

Likewise, if the gate bus line GL(4) has a wire breakage portion d2, the liquid crystal alignment can be appropriately controlled in a unit region U which is connected between the wire breakage portion d2 and the first end f1 (the end connected with the gate driver GD) in the gate bus line GL(4). In unit regions U which are connected on the downstream side of the wire breakage portion d2 in the gate bus line GL(4), a predetermined scan signal is not supplied to the TFTs 101.

If in a liquid crystal display device the TFT module 1000 has a line defect, there is a probability that the display characteristics will deteriorate. In a scanned antenna, there is a probability that the directivity, sensitivity, etc., of the antenna will deteriorate due to a line defect.

To reduce line defects, for example, in the case of manufacturing a liquid crystal display device, an inspection is carried out as to whether the TFT module 1000 has a defect such as wire breakage, short circuit, etc., and, if a defect is detected, a required repair step can be carried out. In the liquid crystal display device, the pixel electrode and the counter electrode between which the liquid crystal layer is provided are capable of transmitting light. The alignment of the liquid crystal layer can be directly observed based on whether or not it can transmit visible light. Therefore, in the inspection step of the liquid crystal display device, it is possible to detect the positions of defects by eye observation or image processing.

In comparison, in a scanned antenna, the patch electrode and the slot electrode used for controlling the alignment of the liquid crystal are usually non-transparent metal electrodes. Therefore, it is difficult to directly observe the alignment in each of the unit regions U so that the presence/absence and position of a defect cannot be easily detected. Due to this problem, it is difficult to carry out an appropriate repair process. Also in the case of a liquid crystal display device, as the size of the TFT module 1000 increases, the mass productivity can be decreased due to detection of defects by visual perception and a repair step.

The present inventors strenuously studied the configuration of a TFT module in which defects in the TFT module, such as wire breakage, short circuit, etc., can be easily detected without carrying out eye observation, and arrived at the present invention. Hereinafter, embodiments of the present invention are described.

First Embodiment

In the TFT module of the first embodiment, each of the source bus lines SL and/or the gate bus lines GL has an end connected with a driver (first end) and the opposite end (second end). The second end is connected with a line for current sensing (hereinafter, referred to as "feedback line"). In the TFT module of the present embodiment, by sensing an electric current in the feedback line, the presence/absence of a wire breakage in the source bus lines SL and/or the gate bus lines GL can be detected. Therefore, even in a device where it is difficult to visually perceive a line defect which is attributed to a wire breakage, the presence/absence of a wire breakage can be easily detected. Thus, it is possible to carry out a required repair step. Alternatively, by supplying a predetermined signal to a source bus line SL or a gate bus line GL in which a wire breakage is detected using a feedback line as an output line, a line defect which is attributed to a wire breakage can be reduced.

Figure 1:
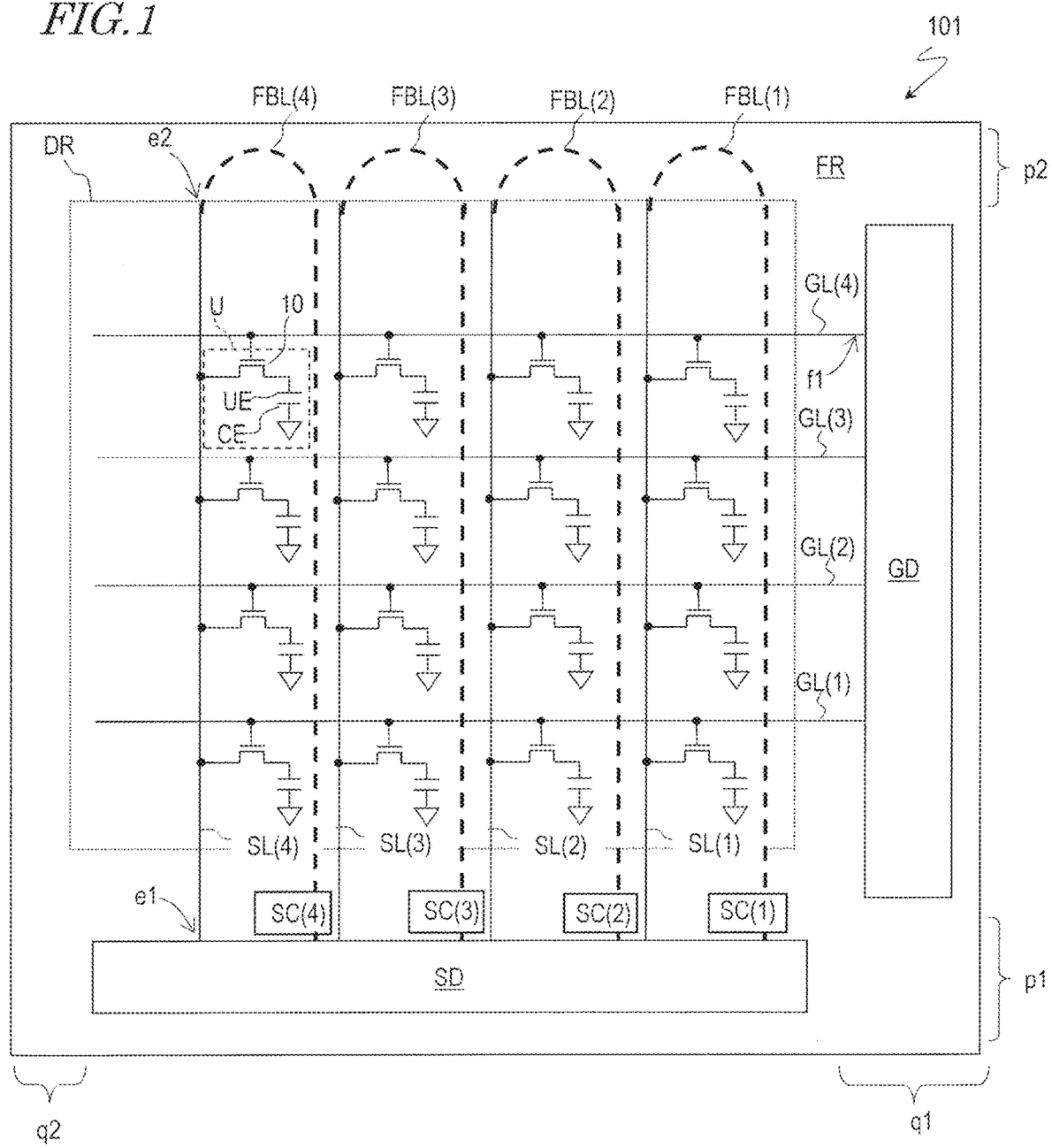
FIG. 1 is a schematic plan view showing a TFT module 101 of the first embodiment.

FIG. 1 is a schematic plan view showing a TFT module 101 of the first embodiment. In FIG. 1, components which are equivalent to those of the TFT module 1000 that has previously been described with reference to FIG. 18 are designated with the same reference numerals. The description of features equivalent to those of the TFT module 1000 will be appropriately omitted.

The TFT module 101 is different from the TFT module 1000 shown in FIG. 18 in that the TFT module 101 further includes a plurality of feedback lines FBL and a plurality of current sensing circuits SC. FIG. 1 shows four of the plurality of feedback lines FBL, which are referred to as feedback lines FBL(1)-FBL(4), and four of the plurality of current sensing circuits SC, which are referred to as current sensing circuits SC(1)-SC(4). Also, in FIG. 1, portions of the second region R2 lying below and above the first region R1 and at the right and left of the first region R1 are referred to as peripheral portions p1, p2, q1, q2, respectively.

Each of the plurality of current sensing circuits SC is located in the second region R2 and is connected with a corresponding feedback line FBL. The current sensing circuits SC may be located near the source driver SD. For example, the source driver SD and the current sensing circuits SC may be located in the same peripheral portion (herein, peripheral portion p1). The current sensing circuits SC may be monolithically formed in the TFT module 101 or may be mounted to the TFT module 101.

Each of the feedback lines FBL is connected with a corresponding one of the current sensing circuits SC and with the end (second end) e2 of a corresponding one of the source bus lines SL. The "second end" of the source bus lines SL is an end e2 which is opposite to the end (first end) e1 connected with the source driver SD. That is, a feedback line FBL is connected on the downstream side of a plurality of TFTs 10 to which the source bus line SL is to supply signals. In this example, the feedback lines FBL extend from the peripheral portion p2 of the second region R2 to the peripheral portion p1 (which is opposite to the peripheral portion p2 with the first region R1 interposed therebetween) so as to traverse the first region R1.

In the TFT module 101, when a data signal is supplied from the source driver SD to the source bus lines SL, each of the current sensing circuits SC senses whether or not an electric current Isense (hereinafter, "sense current") flows through a corresponding feedback line FBL. When the sense current Isense does not flow (Isense=0(A)), it is estimated that a source bus line SL which is connected with that feedback line FBL has a wire breakage.

Each of the current sensing circuits SC may have an input/output terminal for connection with the feedback line FBL. The input/output terminal may include a bidirectional buffer. In this case, in driving a device, a predetermined signal (referred to as "auxiliary data signal") can be supplied to a source bus line SL in which a wire breakage is detected via the feedback line FBL. As described herein, the feedback line FBL is allowed to function as an output line, and therefore, the unit region U connected with the source bus line SL in which the wire breakage is detected can be driven without precisely specifying the position of the wire breakage.

<Driving Method I>

An example of the driving method of a device which includes the TFT module 101 (hereinafter, simply abbreviated as "device") is described.

FIG. 2(a) and FIG. 2(b) are plan views of the TFT module 101 for illustrating the driving method. In the example illustrated in FIG. 2(a) and FIG. 2(b), the source bus line SL(4) has a wire breakage portion d1.

As shown in FIG. 2(a), when a predetermined data signal Vsa is supplied from the source driver SD to each of the source bus lines SL, each of the unit regions U is driven (the liquid crystal alignment is controlled). At this point in time, concurrently with driving of the unit regions U, sense currents Isense flowing through respective ones of the feedback lines FBL are sensed by the current sensing circuits SC, whereby the presence/absence of a wire breakage in the source bus lines SL is detected. Output voltages (output signals) from the respective ones of the current sensing circuits SC are input to, for example, the source driver SD.

In this example, the sense current Isense is not input to the current sensing circuit SC(4) from the feedback line FBL(4) that is connected with the source bus line SL(4) and, therefore, it is judged that the source bus line SL(4) has a wire breakage. Meanwhile, the predetermined sense current Isense (>0) is detected from the other feedback lines FBL (1)-FBL(3) and, therefore, it is judged that the source bus lines SL(1)-SL(3) have no wire breakage.

Then, as shown in FIG. 2(b), an auxiliary data signal Vsb is supplied from the source driver SD to a source bus line SL in which a wire breakage is detected (herein, source bus line SL(4)) via a feedback line FBL (herein, feedback line FBL(4)). As a result, a data signal is supplied to the source bus line SL(4) from the first end e1, and an auxiliary data signal Vsb is supplied to the source bus line SL(4) from the second end e2 that is connected with the feedback line FBL(4).

The auxiliary data signal Vsb may be equal to a data signal Vsa which is to be supplied to that source bus lines SL from the source driver SD (hereinafter, also referred to as "main data signal"). Alternatively, in consideration of the length of the feedback lines FBL, the voltage of the auxiliary data signal Vsb may be set to a level higher (or lower) than the voltage of the main data signal Vsa.

Thereby, a data signal Vsa is supplied to a TFT 10 connected between the first end e1 and the wire breakage portion d1 in the source bus line SL(4), while an auxiliary data signal Vsb is supplied to TFTs 10 connected between the wire breakage portion d1 and the second end e2. Thus, it is possible to drive all the unit regions U connected with the source bus line SL(4).

Breakage detection information which specifies a source bus line SL in which a wire breakage is once detected may be produced and stored in a memory. Thereby, in a subsequent turn of the driving, to the source bus line SL in which a wire breakage is once detected, it is possible to supply the auxiliary data signal Vsb from the feedback line FBL without sensing the presence/absence of a wire breakage by the sense current Isense. Also, the breakage detection information may be updated every time the device is driven.

Thus, according to the present embodiment, even if it is difficult to visually perceive a defect in the TFT module 101 such as wire breakage, occurrence of a line defect due to a wire breakage can be suppressed. In the above-described driving method, while the device is driven, an auxiliary data signal is supplied only to a line in which the presence/absence of a wire breakage is sensed and which is judged to have a wire breakage. Therefore, in the manufacturing process of the device, the inspection step for inspecting the presence/absence and position of a wire breakage and the repair step for repairing a wire breakage can be omitted. Even if a new wire breakage is caused by repeatedly using the device, a line defect which is attributed to a wire breakage can be suppressed.

<Manufacturing Method and Driving Method II>

The presence/absence of a wire breakage may be detected during the manufacture of the device in addition to, or instead of, the driving of the device. In this case, the manufacturing method of the device includes the inspection step which will be described below.

First, a data signal for inspection is supplied to the source bus lines SL, and the respective electric currents of the feedback lines FBL are sensed. Thereby, the presence/absence of a wire breakage in the source bus lines SL is detected.

Then, breakage detection information which specifies a source bus line SL which is detected as having a wire breakage (or a feedback line FBL which is connected with that source bus line SL) is produced and stored in a memory. The memory may be located in the source driver SD or control circuit. In this way, a device is realized in which the breakage detection information is stored.

The driving method of the device in which the breakage detection information is stored includes the step of retrieving the above-described breakage detection information and, in supplying a data signal Vsa to a source driver SD in which a wire breakage is detected beforehand based on the retrieved breakage detection information, the step of supplying an auxiliary data signal Vsb to a feedback line FBL which is connected with the source bus line SL in which the wire breakage is detected. This method can suppress a line defect which is attributed to a wire breakage in a source bus line SL in which a wire breakage is detected.

Alternatively, the manufacturing method of the device may include the above-described inspection step, the step of producing and outputting breakage detection information, and a repair step for repairing a detected wire breakage.

After a liquid crystal panel (including a TFT module, a counter substrate and a liquid crystal layer) is manufactured using a TFT module, the above-described inspection step may be carried out before peripheral circuits such as driving circuits (e.g., driver IC) are mounted (also referred to as "panel state") or may be carried out after they are mounted.

<Variations>

Variations of the TFT module of the present embodiment are described.

Figure 3:
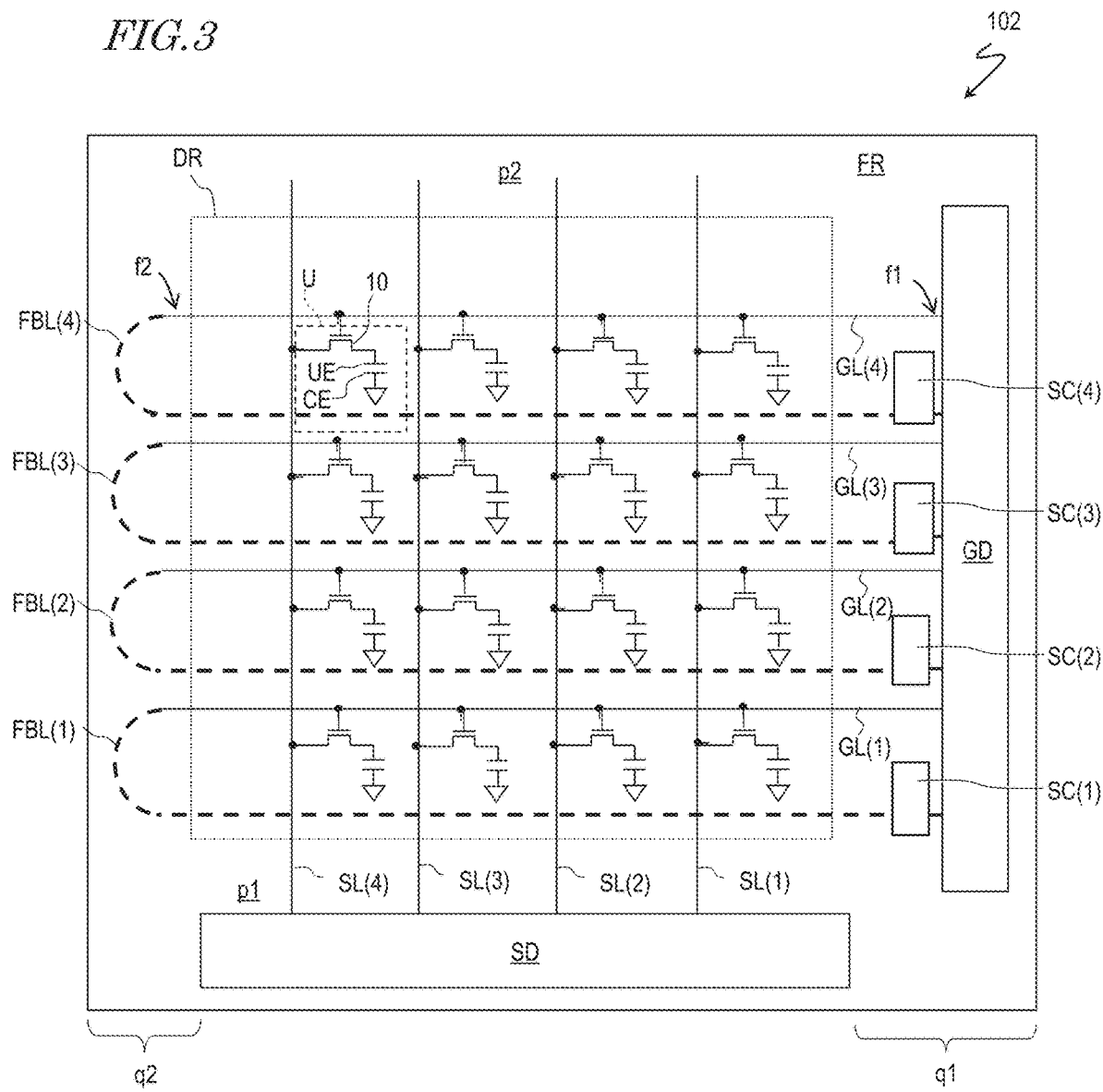
FIG. 3 is a schematic plan view showing an alternative TFT module 102 of the first embodiment.

FIG. 3 is a schematic plan view showing an alternative TFT module 102 of the first embodiment.

The TFT module 102 is different from the TFT module 101 shown in FIG. 1 in that each of the plurality of feedback lines FBL is electrically coupled with a corresponding one of the gate bus lines GL. The description of features equivalent to those of the TFT module 1000 that has previously been described with reference to FIG. 18 will be appropriately omitted.

The TFT module 102 further includes a plurality of feedback lines FBL and a plurality of current sensing circuits SC. FIG. 3 shows four of the plurality of feedback lines FBL, which are referred to as feedback lines FBL(1)-FBL(4), and four of the plurality of current sensing circuits SC, which are referred to as current sensing circuits SC(1)-SC(4).

Each of the plurality of current sensing circuits SC is located in the second region R2 and connected with a corresponding one of the feedback lines FBL. The current sensing circuits SC may be located near the gate driver GD. For example, the gate driver GD and the current sensing circuits SC may be located in the same peripheral portion of the second region R2 (herein, peripheral portion q1).

Each of the feedback lines FBL is connected with a corresponding one of the current sensing circuits SC and with the second end f2 (the end opposite to the first end f1 connected with the gate driver GD) of a corresponding one of the gate bus lines GL. In this example, the feedback lines FBL extend from the peripheral portion q2 of the second region R2 to the peripheral portion q1 of the second region R2 so as to traverse the first region R1.

In the TFT module 102, when a scan signal is supplied from the gate driver GD to the gate bus lines GL, each of the current sensing circuits SC senses whether or not a sense current Isense flows through a corresponding one of the feedback lines FBL. When the sense current Isense does not flow (Isense=0(A)), it is estimated that a gate bus line GL which is connected with that current sensing circuit SC via a feedback line FBL has a wire breakage.

Also in the TFT module 102, in the same way as in the TFT module 101, a terminal of each of the current sensing circuits SC which is connected with a feedback line FBL may be an input/output terminal which includes a bidirectional buffer. Thus, in driving a device, a predetermined signal (referred to as "auxiliary scan signal") can be supplied to a gate bus line GL in which a wire breakage is detected via the feedback line FBL.

Then, an example of the driving method of a device which includes the TFT module 102 is described with reference to FIG. 4(a) and FIG. 4(b) where the gate bus line GL(4) has a wire breakage portion d2.

As shown in FIG. 4(a), when a predetermined scan signal Vga is supplied from the gate driver GD to respective ones of the gate bus lines GL, sense currents Isense flowing through respective ones of the feedback lines FBL are sensed by the current sensing circuits SC, whereby the presence/absence of a wire breakage in the gate bus lines GL is detected. The output signals from respective ones of the current sensing circuits SC are input to, for example, the gate driver GD.

In this example, the sense current Isense is not input to the current sensing circuit SC(4) from the feedback line FBL which is connected with the gate bus line GL(4) and, therefore, it is judged that the gate bus line GL(4) has a wire breakage.

Then, as shown in FIG. 4(b), an auxiliary scan signal Vgb is supplied from the gate driver GD to a gate bus line GL in which a wire breakage is detected (herein, gate bus line GL(4)) via a feedback line FBL (herein, feedback line FBL(4)). As a result, a scan signal Vga is supplied to the gate bus line GL(4) from the first end f1, and an auxiliary scan signal Vgb is supplied to the gate bus line GL(4) from the second end e2 that is connected with the feedback line FBL(4). Note that, in the line sequential scanning, even if a wire breakage is detected in a gate bus line GL, it is sometimes difficult to supply an auxiliary scan signal Vgb to a feedback line FBL within that selection period. Also in this case, the breakage detection information of the gate bus line GL is produced and stored, and in a subsequent vertical scan period, during the selection period of the gate bus line GL in which a wire breakage is detected, an auxiliary scan signal Vgb can be supplied to a feedback line FBL connected with that gate bus line GL.

The auxiliary scan signal Vgb may be equal to the main scan signal Vga that is to be supplied from the gate driver GD to that gate bus line GL. Alternatively, in consideration of the length of the feedback lines FBL, the voltage of the auxiliary scan signal Vgb may be set to a level higher (or lower) than the voltage of the main scan signal Vga.

Thereby, a scan signal Vga is supplied to a TFT 10 connected between the first end f1 and the wire breakage portion d2 in the gate bus line GL(4), while an auxiliary scan signal Vgb is supplied to TFTs 10 connected between the wire breakage portion d2 and the second end e2. Thus, it is possible to drive all the unit regions U connected with the gate bus line GL(4).

Also in this variation, in the same way as in driving method I, breakage detection information which specifies a gate bus line GL in which a wire breakage is once detected may be produced and stored in a memory. Also in this variation, the presence/absence of a wire breakage may be detected during the manufacture of the device in addition to, or instead of, the driving of the device. In this case, the manufacturing method of the device may include the inspection step and the step of producing information about a gate bus line GL in which a wire breakage is sensed (breakage detection information) and storing the breakage detection information in a memory. The driving method of the device in which the breakage detection information is stored may include, as does the driving method II, in supplying a scan signal Vga to a gate bus line GL in which a wire breakage is sensed, the step of supplying an auxiliary scan signal Vgb to a feedback line FBL which is connected with that gate bus line GL.

<Configuration of Current Sensing Circuits SC>

Then, the configuration of the current sensing circuits SC is more specifically described. In the example described herein, the feedback lines FBL are connected with the source bus lines SL, although the same applies to a case where the feedback lines FBL are connected with the gate bus lines GL.

FIG. 5(a) is a circuit diagram showing an example of a current sensing circuit SC_a. FIG. 5(b) is a diagram showing the connection between the current sensing circuit SC_a and the source driver SD.

As shown in FIG. 5(a) and FIG. 5(b), the current sensing circuit SC_a includes a comparator 21, resistors 22-24, and an output terminal 25. The non-inverting input terminal of the comparator 21 is connected with a feedback line FBL, and the inverting input terminal is grounded. The output terminal of the comparator 21 is connected with, for example, the source driver SD via the output terminal 25. The output voltage (output signal) Voutput is output from the output terminal 25 to the source driver SD.

If a data signal Vsa is input from the source driver SD to a source bus line SL which has a wire breakage, the sense current Isense does not flow through the feedback line FBL and, therefore, the output signal Voutput is "Low". In comparison, if the source bus line SL has no wire breakage, the sense current Isense flows through the feedback line FBL and, therefore, the output signal Voutput is "High".

In this example, the resistors 22-24 shown in FIG. 5(a) have resistances Rsense, RFB1, and RFB2, respectively. The output signal Voutput in a High state is represented by the following formula.

$$\text{Voutput} = \text{Isense} \cdot \text{Rsense}(1 + \text{RFB2}/\text{RFB1})$$

The source driver SD may produce breakage detection information which specifies a source bus line SL in which a wire breakage is detected based on the output signals Voutput of respective ones of the current sensing circuits SC and output the produced breakage detection information. Based on this breakage detection information, a required repair step can be carried out. Alternatively, the breakage detection information may be stored in a memory and used in driving the device.

Figure 6:
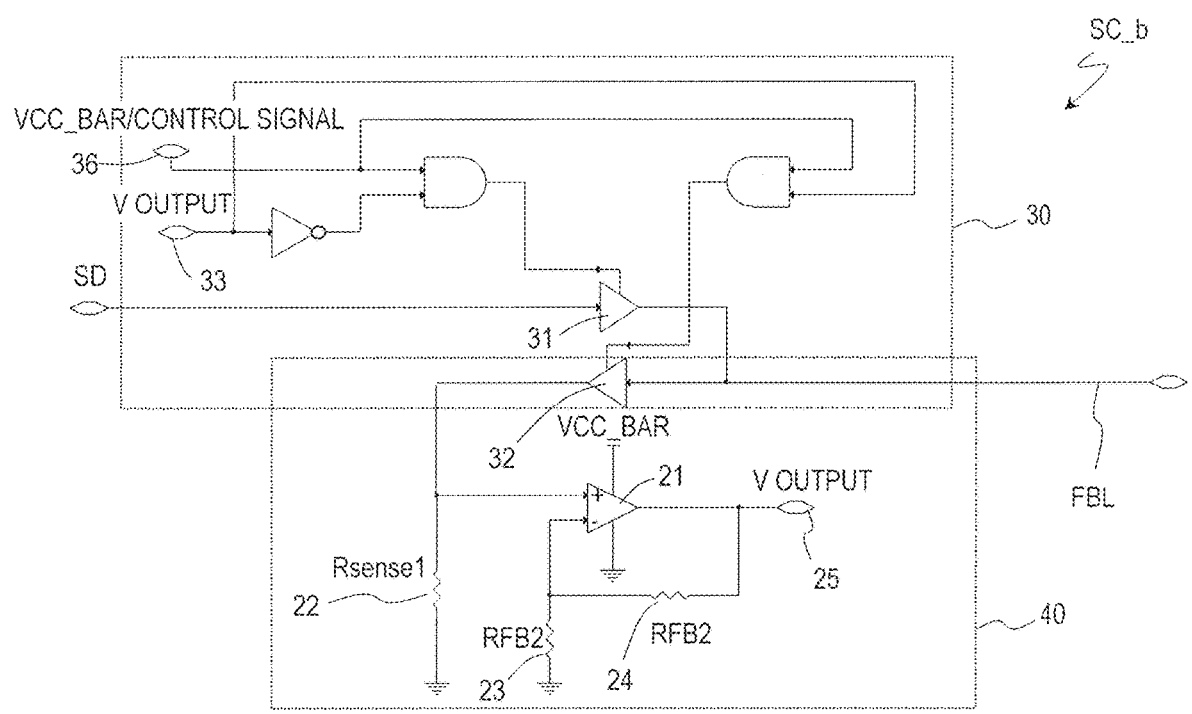
FIG. 6 is a circuit diagram illustrating an alternative current sensing circuit SC_b of the first embodiment.

FIG. 6 is a circuit diagram illustrating an alternative example of the current sensing circuits SC.

The current sensing circuit SC_b includes an input/output terminal, which includes a bidirectional buffer 30, and a current sensing portion 40. The current sensing portion 40 may have the same configuration as that of the current sensing circuit SC_a shown in FIG. 5(a).

The bidirectional buffer 30 includes three-state buffers 31, 32. The input terminal of the three-state buffer 32 is connected with the feedback line FBL, and the output terminal is connected with the current sensing portion 40. The input terminal of the three-state buffer 31 is connected with the source driver SD, and the output terminal is connected with the feedback line FBL. These buffers 31, 32 are controlled such that one is ON while the other is OFF.

The three-state buffer 31 is switched between ON and OFF according to the control signal input to a terminal 33 of the bidirectional buffer 30. The control signal used may be the output signal Voutput that is output from the output terminal 25 of the current sensing portion 40.

Next, the operation of the current sensing circuit SC_b is described with reference to FIG. 7(a) and FIG. 7(b). In FIG. 7, the "High" state and the "Low" state of each signal are respectively represented by "H" and "L".

First, the control signal input to the terminal 33 is set to High, or the terminal 36 (VCC_BAR/control signal) is initialized to Low, such that the three-state buffer 31 is OFF and the three-state buffer 32 is ON.

In driving the device, a data signal is supplied from the source driver SD to unshown source bus lines SL, and the respective unit regions U are driven. In this step, if a sense current Isense (>0) is input from the feedback line FBL to the three-state buffer 32 in the ON state, the output signal Voutput from the current sensing portion 40 is "High" as shown in FIG. 7(a). Since the output signal Voutput in the High state is input as the control signal to the terminal 33, the three-state buffer 31 is maintained OFF. Since the three-state buffer 31 is OFF, the signal from the source driver SD is not input to the feedback line FBL.

In comparison, when the source bus line SL has a wire breakage and the sense current Isense is not input from the feedback line FBL to the three-state buffer 32, the output signal Voutput from the current sensing portion 40 is "Low" as shown in FIG. 7(b). Therefore, the control signal input to the terminal 33 is "Low" and, accordingly, the three-state buffer 31 switches to ON and the three-state buffer 32 switches to OFF. Since the three-state buffer 31 is ON, the signal from the source driver SD (auxiliary data signal) is input to the feedback line FBL via the three-state buffer 31. In this way, an auxiliary data signal can be supplied to a source bus line SL which has a wire breakage via the feedback line FBL.

<Other Configurations>

The configuration of the TFT module of the present embodiment is not limited to the above-described examples. For example, the feedback line FBL and the current sensing circuit SC may be respectively provided to both the gate bus line GL and the source bus line SL. The feedback line FBL may not be provided to all of the gate bus lines GL or all of the source bus lines SL. The feedback line FBL may be connected with at least one of the gate bus lines GL or the source bus lines SL. For example, a feedback line FBL may be provided to every other one of the plurality of gate bus lines GL or source bus lines SL.

In the TFT modules 101, 102, part of the feedback lines FBL is located in the first region R1, although the feedback lines FBL may be located only in the second region R2.

Figure 8:
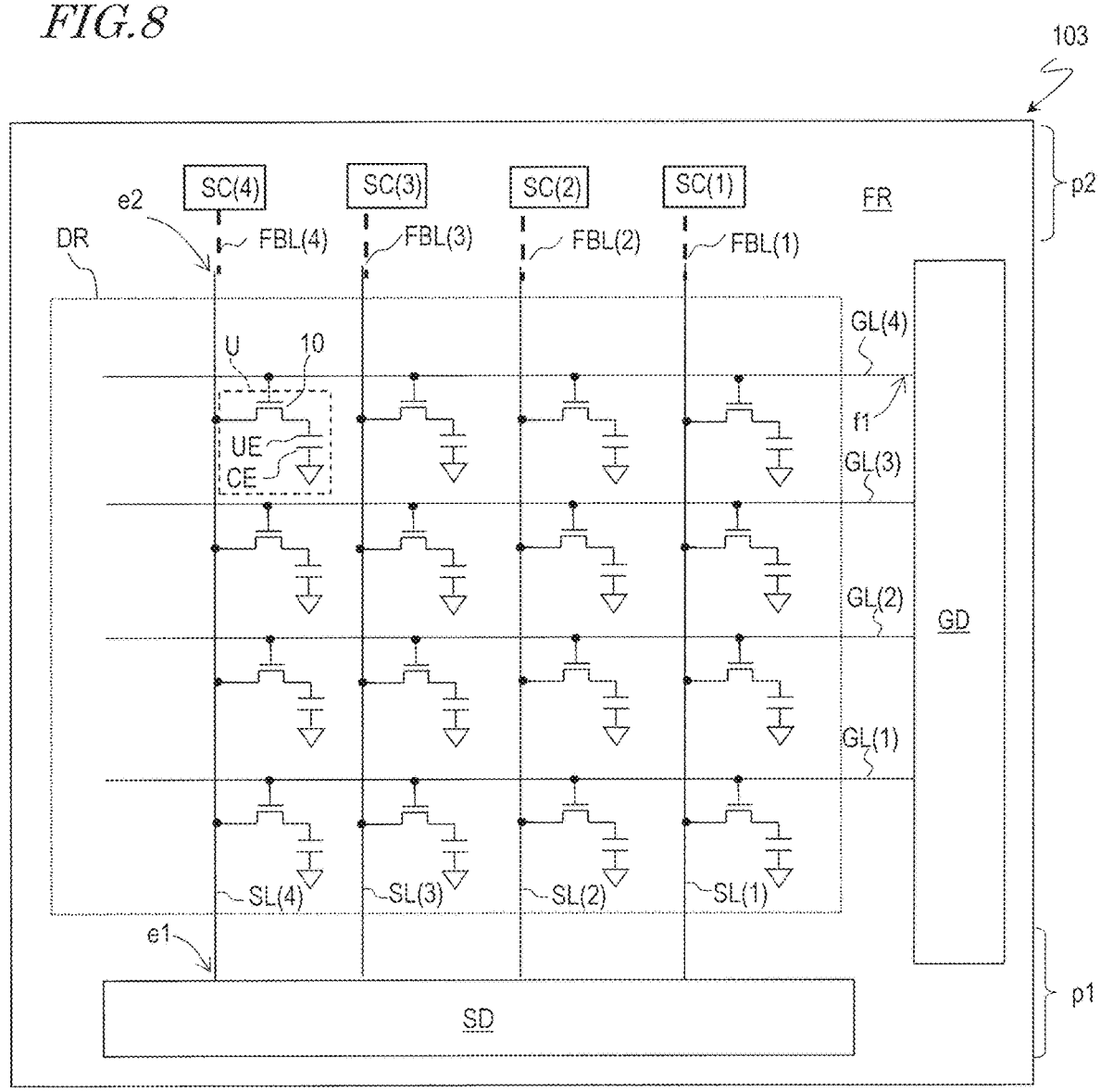
FIG. 8 is a plan view illustrating an alternative TFT module 103 of the first embodiment.
Figure 9:
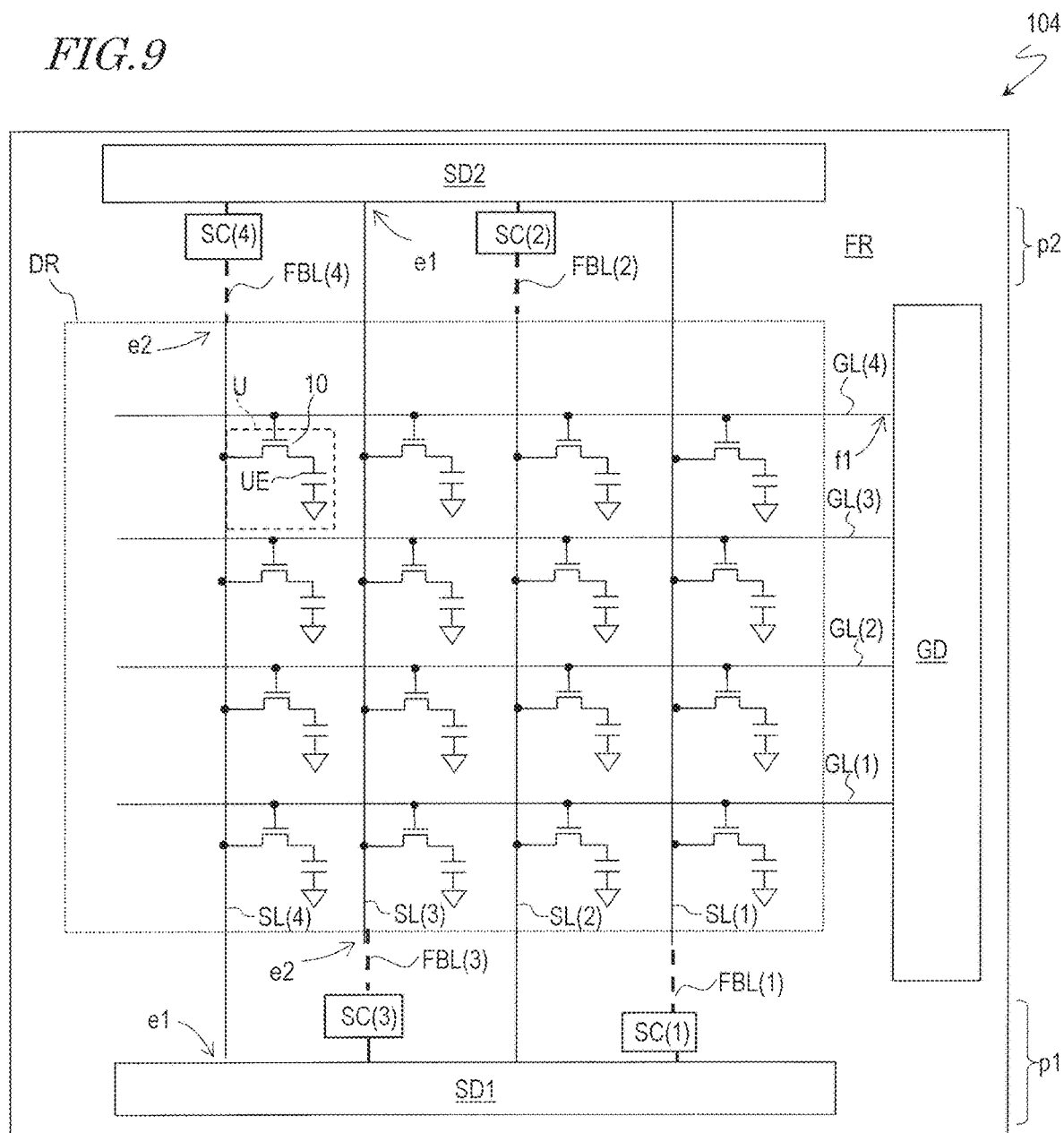
FIG. 9 is a plan view illustrating an alternative TFT module 104 of the first embodiment.
Figure 10:
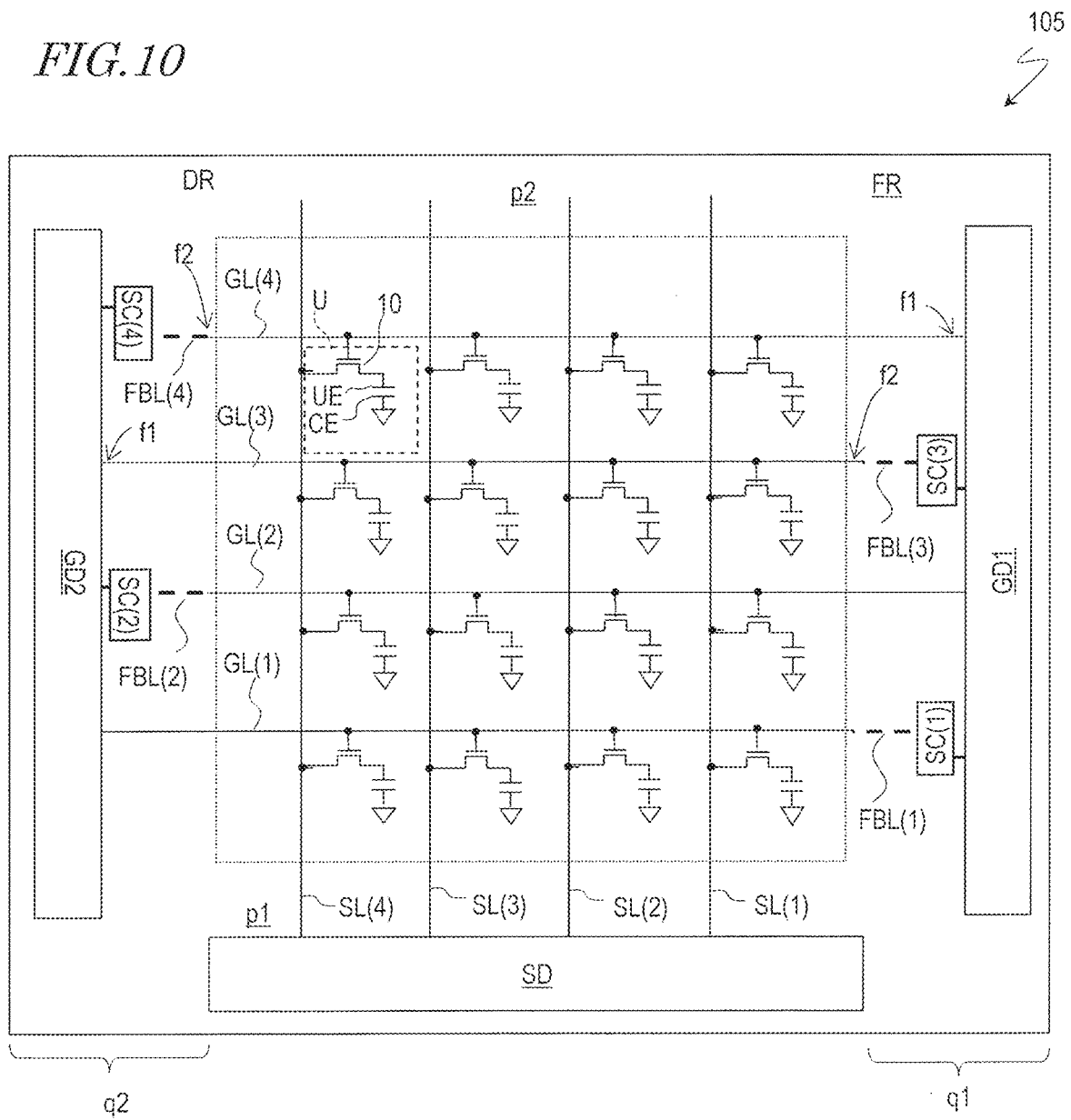
FIG. 10 is a plan view illustrating an alternative TFT module 105 of the first embodiment.

FIG. 8 to FIG. 10 are plan views illustrating alternative TFT modules 103-105 of the present embodiment.

In the TFT module 103 shown in FIG. 8, the source driver SD is located in the peripheral portion p1 of the second region R2, and the current sensing circuits SC are located in the peripheral portion p2 that is opposite to the peripheral portion p1 with the first region R1 interposed therebetween. Each of the feedback lines FBL may extend from the second end e2 of a corresponding one of the source bus lines SL to the current sensing circuit SC in the peripheral portion p2 of the second region R2. In order to allow the feedback lines FBL to also function as the output lines, respective ones of the current sensing circuits SC are connected with the control circuit or the source driver SD such that an auxiliary data signal is input to respective ones of the current sensing circuits SC.

Likewise, although not shown, when each of the feedback lines FBL is connected with a corresponding one of the gate bus lines GL, the gate driver GD may be located in the peripheral portion q1, and the current sensing circuits SC may be located in the peripheral portion q2.

In the TFT module 104 shown in FIG. 9, the first source driver SD1 and the second source driver SD2 are respectively provided in the peripheral portions p1, p2 of the second region R2. For example, source bus lines SL of even-numbered columns (herein, source bus lines SL(2), SL(4)) may be connected with the terminals of the first source driver SD1, and source bus lines SL of odd-numbered columns (herein, source bus lines SL(1), SL(3)) may be connected with the terminals of the second source driver SD2. In this case, the current sensing circuits SC(2), SC(4) corresponding to the source bus lines SL(2), SL(4) of even-numbered columns may be located in the peripheral portion p2, and the current sensing circuits SC(1), SC(3) corresponding to the source bus lines SL(1), SL(3) of odd-numbered columns may be located in the peripheral portion p1.

Likewise, as illustrated in FIG. 10, the first gate driver GD1 and the second gate driver GD2 may be respectively provided in the peripheral portions q1, q2 of the second region R2. The gate bus lines GL of even-numbered rows may be connected with the first gate driver GD1, and the gate bus lines GL of odd-numbered rows may be connected with the second gate driver GD2. In this case, current sensing circuits SC corresponding to the gate bus lines GL of even-numbered rows may be located in the peripheral portion q2, and current sensing circuits SC corresponding to the gate bus lines GL of odd-numbered rows may be located in the peripheral portion q1.

Also in the TFT modules 104, 105, when a wire breakage is detected, it is possible to allow the feedback lines FBL to function as output lines. In such a case, the TFT modules are configured such that an auxiliary data signal or auxiliary scan signal is input to respective ones of the current sensing circuits SC. For example, in the TFT module 104, a data signal which is to be supplied to the source bus lines SL of odd-numbered columns and, when necessary, an auxiliary data signal which is to be supplied to the source bus lines SL of even-numbered columns may be supplied from the control circuit to the source driver SD2. Thus, the current sensing circuits SC connected with the source bus lines SL of even-numbered columns (herein, current sensing circuits SC(2), SC(4)) can receive an auxiliary data signal from the source driver SD2.

Figure 11:
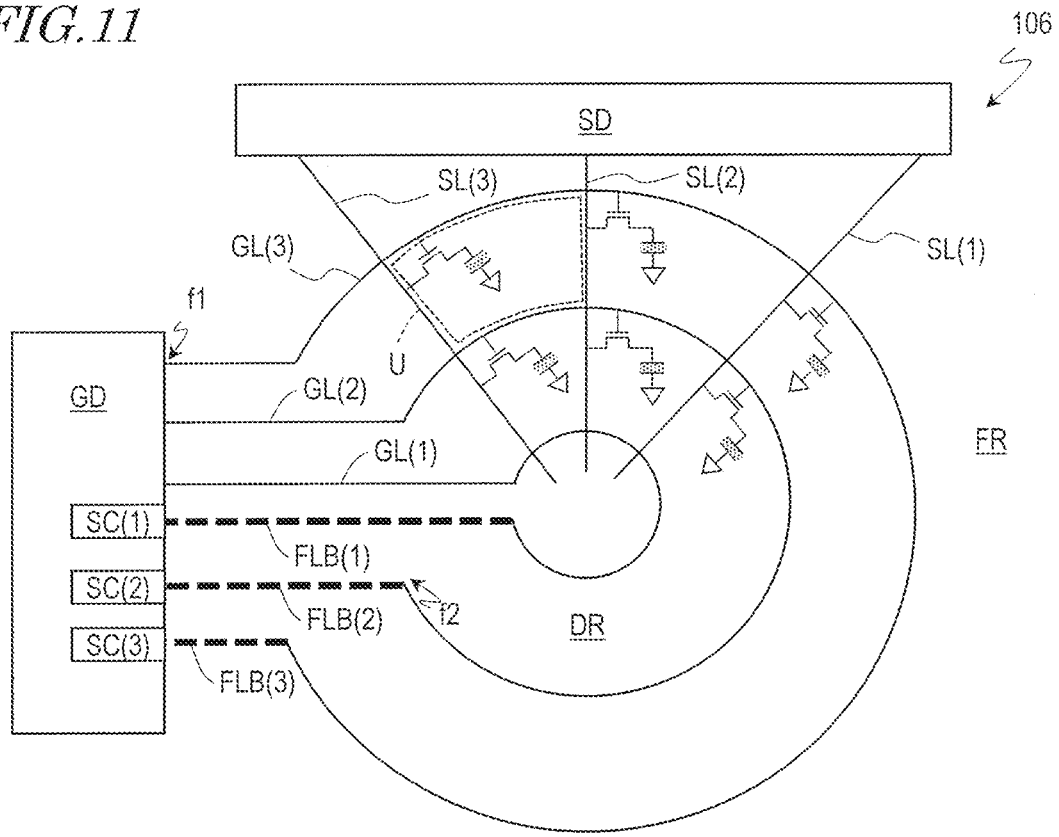
FIG. 11 is a plan view illustrating an alternative TFT module 106 of the first embodiment.
Figure 12:
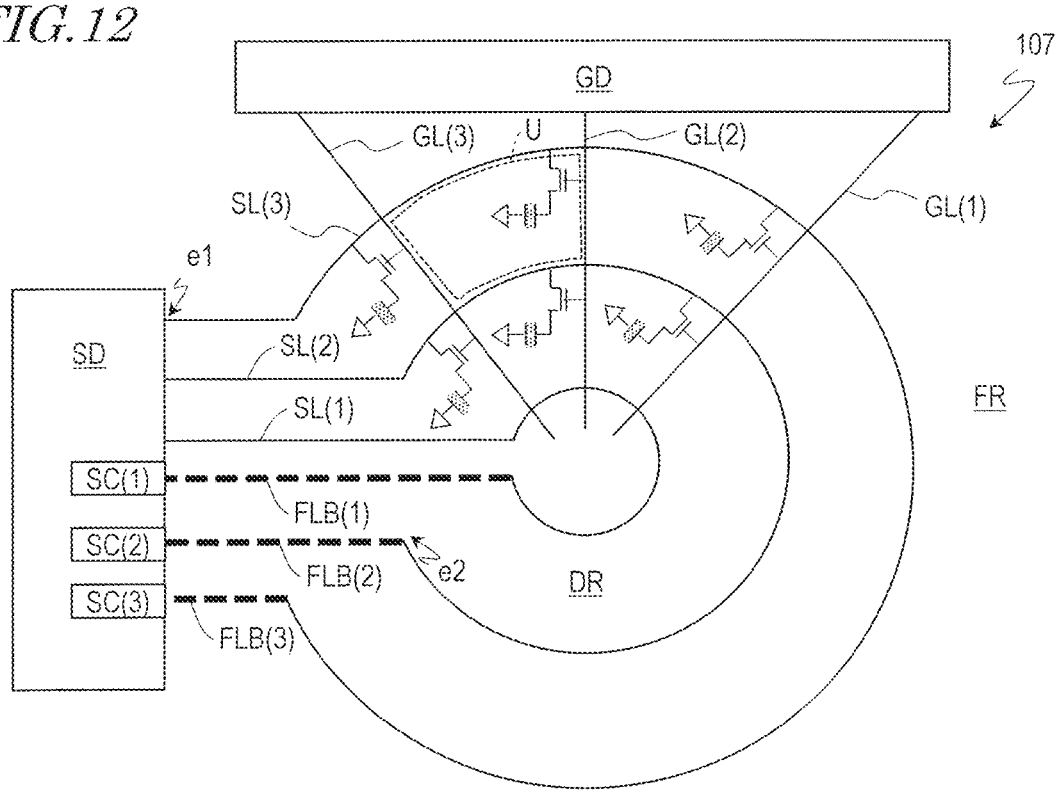
FIG. 12 is a plan view illustrating an alternative TFT module 107 of the first embodiment.

FIG. 11 and FIG. 12 are plan views illustrating still alternative TFT modules 106, 107 of the present embodiment. As illustrated in the drawings, a plurality of unit regions U may be concentrically arranged. Such TFT modules 106, 107 are suitably applicable to, for example, a scanned antenna. FIG. 11 shows an example where feedback lines FBL are connected with gate bus lines GL. FIG. 12 shows an example where feedback lines FBL are connected with source bus lines SL.

In the TFT module 106 shown in FIG. 11, each of the plurality of gate bus lines GL is arranged so as to extend from the gate driver GD and make a circle in the first region R1. Each of the plurality of source bus lines SL extends from the source driver SD toward the center of the circle. The plurality of current sensing circuits SC are located near the gate driver GD. The first end f1 of each of the gate bus lines GL is connected with the gate driver GD, and the second end f2 is connected with a corresponding one of the feedback lines FBL. In this example, each of the gate bus lines GL makes a circle and returns to the vicinity of the gate driver GD and, therefore, it is not necessary to spread around the feedback lines FBL, and the feedback lines FBL are located only in the second region R2.

In comparison, in the example shown in FIG. 12, each of the plurality of source bus lines SL is arranged so as to extend from the source driver SD and make a circle in the first region R1. Each of the plurality of gate bus lines GL extends from the gate driver GD toward the center of the circle. The plurality of current sensing circuits SC are located near the source driver SD. The first end of each of the source bus lines SL is connected with the source driver SD, and the second end is connected with a corresponding one of the feedback lines FBL. In this example, each of the source bus lines SL makes a circle and returns to the vicinity of the source driver SD and, therefore, it is not necessary to spread around the feedback lines FBL, and the feedback lines FBL are located only in the second region R2.

In FIG. 11 and FIG. 12, for the sake of simplicity, the concentrically-arranged gate bus lines GL (or source bus lines SL) are connected with the same number of unit regions U, although gate bus lines GL (or source bus lines SL) running along outer tracks may be connected with a greater number of unit regions U.

In the example described herein, the gate bus lines GL are arranged in m concentric circles. For example, a single gate bus line GL is provided for each circle, and there are m gate bus lines GL in total. If the diameter of the first region R1 is for example 800 mm, m is for example 200. Where the gate bus line GL of the innermost track is the first gate bus line GL, the first gate bus line GL is connected with n (e.g., 30) unit regions U, and the $m^{th}$ gate bus line GL is connected with nx (e.g., 620) unit regions U. In such an arrangement, of nx source bus lines SL connected with nx unit regions U that form the circle of the outermost track, n source bus lines SL which are also connected with the unit regions U that form the circle of the innermost track are connected with m unit regions U, while the number of unit regions U connected with the other source bus lines SL is smaller than m.

Although not shown, a still alternative TFT module of the present embodiment may not include a current sensing circuit. In this case, the end of each of the feedback lines FBL which is not connected with the source bus line SL (or gate bus line GL) may be connected with, for example, a corresponding one of a plurality of inspection terminals located in the second region. In a device which includes such a TFT module, the above-described inspection step is carried out while it is in the form of a panel.

Hereinafter, the manufacturing method of the above-described device is described with an example where the feedback lines FBL are connected with the source bus lines SL.

First, a TFT substrate and a counter substrate are provided so as to oppose each other with a liquid crystal layer interposed therebetween, whereby a liquid crystal panel is produced.

Then, a signal for inspection is supplied to each of the source bus lines SL of the liquid crystal panel using, for example, an inspection device, for sensing an electric current in each of the feedback lines FBL. Herein, each inspection terminal of the liquid crystal panel is connected with a current sensing circuit provided in the inspection device, and sensing of an electric current is carried out using the inspection device. Thereby, the presence/absence of a wire breakage in the source bus lines SL is detected.

Then, breakage detection information is produced which specifies a source bus line SL which is detected as having a wire breakage (or a feedback line FBL connected with that source bus line SL). The breakage detection information may be stored in, for example, a memory provided in the inspection device.

Thereafter, a required repair step is carried out. Then, peripheral circuits such as drivers may be mounted to the liquid crystal panel.

<Configuration of Device Which Includes TFT Module>

Next, the configuration of a device which includes a TFT module of the present embodiment is described with a display device example and a scanned antenna example.

Configuration of Liquid Crystal Display Device

FIG. 13 is a schematic cross-sectional view of a liquid crystal display device (LCD panel) 900.

The LCD panel 900 includes a TFT module 910, a counter substrate 920, and a liquid crystal layer LC interposed between the TFT module 910 and the counter substrate 920.

The TFT module 910 includes a transparent substrate 911 as a supporting substrate, a plurality of TFTs 912, and a plurality of pixel electrodes 914 which are unit electrodes UE. The TFTs 912 and the pixel electrodes 914 are provided in respective ones of the unit regions U (pixel regions). The pixel electrodes 914 are transparent electrodes. As the TFT module 910, the above-described TFT modules 101-107 can be used.

The counter substrate 920 includes a transparent substrate 921 and a common electrode 924 which is the counter electrode CE. Although not shown, a color filter layer (not shown) and alignment films (not shown) may be provided. The common electrode 924 is common to the plurality of unit regions U that form the first region R1.

The pixel electrode 914 of the TFT module 910, the counter electrode 924 of the counter substrate 920, and the liquid crystal layer LC provided between these electrodes form liquid crystal capacitance Clc. Each liquid crystal capacitance corresponds to a pixel.

In the LCD panel 900, line sequential scanning is carried out. In the line sequential scanning system, a data signal supplied to the unit electrode UE (also referred to as "display signal") is a data signal which is supplied, when a TFT 912 selected by a scan signal supplied from the gate driver GD to a gate bus line GL is ON, to a source bus line SL connected with that TFT 912. Therefore, TFTs 912 connected with a certain gate bus line GL are concurrently turned ON and, at that point in time, corresponding display signals are supplied from source bus lines SL connected with the respective TFTs 912 of the unit regions U of that row. This operation is carried out sequentially from the first row (e.g., the uppermost row in the display surface) to the $m^{th}$ row (e.g., the lowermost row in the display surface), whereby a single image (frame) is written and displayed in the first region (display region) R1 formed by m pixel rows. Note that a period between selection of one pixel row and selection of a subsequent pixel row is referred to as horizontal scan period (1H), and a period between selection of one row and subsequent selection of that row is referred to as vertical scan period (1V) or frame.

Driving of the LCD panel 900 is AC driving for the purpose of prevention of flickers. Typically, frame inversion driving is carried out such that the polarity of the data signal is inverted at intervals of one frame (at intervals of one vertical scan period). For example, the polarity is inverted at intervals of 1/60 sec (the period of polarity inversion is 30 Hz). Further, in order to achieve an even distribution of pixels to which voltages of different polarities are applied within each frame, dot inversion driving, line inversion driving, or the like, is carried out. This is because it is difficult to make the magnitude of the effective voltage applied to the liquid crystal layer exactly identical between the positive polarity and the negative polarity.

Configuration of Scanned Antenna

FIG. 14 is a cross-sectional view schematically showing a part of a scanned antenna 800 of the present embodiment. FIG. 14 schematically shows a part of a cross section taken along a radial direction from a power supply pin 830 provided near the center of concentrically-arranged slots.

The scanned antenna 800 includes a TFT module 810, a slot substrate 820, a liquid crystal layer LC interposed between the TFT module 810 and the slot substrate 820, and an electrically-conductive reflector 824 which is arranged so as to oppose the slot substrate 820 via an air layer 822. The scanned antenna 800 is capable of transmitting/receiving microwaves to/from the TFT module 810 side.

The TFT module 810 includes a dielectric substrate 811 such as glass substrate, a plurality of TFTs 812, and a plurality of patch electrodes 814 that are the unit electrodes UE. The TFTs 812 and the patch electrodes 814 are provided in respective ones of the unit regions U. The patch electrodes 814 are metal electrodes. As the TFT module 810, the TFT modules 101-107 of the present embodiment can be used.

The slot substrate 820 includes a dielectric substrate 821 and a slot electrode 825 that is the counter electrode CE provided on the liquid crystal layer LC side of the dielectric substrate 821. The slot electrode 825 is common to the plurality of unit regions U and has a plurality of slots 827. The slots 827 are arranged so as to correspond to the patch electrodes 814.

The slot electrode 825, the electrically-conductive reflector 824, and the dielectric substrate 821 and the air layer 822 interposed between the slot electrode 825 and the electrically-conductive reflector 824 function as a waveguide 829.

The patch electrodes 814, part of the slot electrode 825 which includes the slots 827, and the liquid crystal layer LC interposed between these portions form the unit regions U (antenna units). In each antenna unit, a single patch electrode 814 opposes a part of the slot electrode 825 which includes a single slot 827 via the liquid crystal layer LC, thereby forming liquid crystal capacitance.

FIG. 15(a) and FIG. 15(b) are schematic plan views respectively illustrating a TFT module 810 and a slot substrate 820 in the scanned antenna 800.

In the illustrated example, the first region R1 has a doughnut shape when viewed in the normal direction of the TFT module 101. The second region R2 includes a region R2a at the center of the first region R1 and a region R2b at the periphery of the first region R1.

In the first region R1 of the TFT module 810, the plurality of gate bus lines GL and the plurality of source bus lines SL supported by the dielectric substrate 811 are provided, and the unit regions U are defined by the wires of these lines. The unit regions U are, for example, concentrically arranged in the first region R1. Although not shown, each of the unit regions U includes a TFT and a patch electrode electrically coupled with the TFT (see FIG. 11).

In the slot substrate 820, the slot electrode 825 is provided on the dielectric substrate 821 so as to extend across the first region R1 and the second region R2.

In the first region R1 of the slot substrate 820, the plurality of slots 827 are provided in the slot electrode 825. The slots 827 are arranged so as to correspond to the unit regions U (or patch electrodes). In the illustrated example, the plurality of slots 827 are arranged such that pairs of slots 827 extending in directions which are generally orthogonal to each other are concentrically arranged, whereby a radial inline slot antenna is formed. Since it has generally-orthogonal slots, the scanned antenna 800 is capable of transmitting and receiving circularly-polarized waves.

In the region R2a of the second region R2, the power supply pin 830 is provided at the rear surface side of the slot substrate 820. By the power supply pin 830, microwaves are brought into the waveguide 829 (FIG. 14). The power supply pin 830 is connected with a power supply device. Supply of the power is carried out from the center of the concentric circles along which the slots 827 are arranged.

The TFT module 910 applied to the LCD panel 900 and the TFT module 810 applied to the scanned antenna 800 have the same configuration but are different in the following points.

For example, in the LCD panel 900, an ITO film is usually used as a transparent electrically-conductive film for the pixel electrodes 914 and the counter electrode 924. However, ITO has large tan $\delta_M$ for microwaves and cannot be used as an electrically-conductive layer in the antenna. The slot electrode 825 functions together with the electrically-conductive reflector 824 as the wall of the waveguide 829. Therefore, to suppress transmission of microwaves through the wall of the waveguide 829, it is preferred that the thickness of the wall of the waveguide 829, i.e., the thickness of the metal layer (Cu layer or Al layer), is large. The thickness of the metal layer may be not less than three times the skin depth or not less than five times the skin depth. For example, for microwaves at 10 GHz, using a Cu layer of not less than 3.3 μm in thickness and an Al layer of not less than 4.0 μm in thickness can reduce the microwaves to 1/150. Thus, it is preferred that the slot electrode 825 is formed by a relatively thick Cu or Al layer.

Since the patch electrodes 814 are not the constituents of the waveguide 829, a Cu or Al layer which has a smaller thickness than the slot electrode 825 can be used. Note that, however, to avoid such a loss that when oscillation of free electrons near the slots 827 of the slot electrode 825 induces oscillation of free electrons in the patch electrodes 814 it changes into heat, the resistance is preferably low. From the viewpoint of mass productivity, it is preferred to use an Al layer rather than a Cu layer. The thickness of the Al layer is preferably, for example, not less than 0.3 μm and not more than 2 μm.

The unit regions U in the scanned antenna 800 are not limited to a concentric arrangement but may be in a spiral arrangement as disclosed in Non-patent Document No. 2. Still alternatively, the unit regions U may be in a matrix arrangement as disclosed in Patent Document No. 4.

As for the basic configuration and operational principles of a scanned antenna in which a liquid crystal material is used, refer to Patent Documents Nos. 1-6 and Non-patent Documents Nos. 1 and 2. The disclosures of Patent Documents Nos. 1-6 and Non-patent Documents Nos. 1 and 2 are incorporated herein by reference in their entirety.

Second Embodiment

As previously described, in a display device, dot inversion driving or line inversion driving (source bus line inversion driving) can be carried out. For example, when N line inversion driving is carried out, the source driver includes, for example, N output terminals for outputting positive polarity signals and N output terminals for outputting negative polarity signals which are alternately arranged. Thereby, data signals can be supplied from the source driver to respective ones of the source bus lines SL such that the polarity of the pixel voltage is inverted every N lines.

In comparison, in a scanned antenna, visual uniformity is not required, whereas it is required in the display device. Thus, from the viewpoint of simplicity in driving and power consumption, dot inversion driving or line inversion driving is not carried out in some cases. For example, in an arbitrary frame, driving can be carried out such that all the voltages applied to the patch electrodes have the same polarity and the polarity is inverted every frame. In such a case, the source driver only need to have only output terminals which concurrently output signals of the same polarity. Note that, however, from the viewpoint of mass productivity, the same source driver as that used for line inversion driving may be used. For example, output terminals of the source driver which output signals of one polarity are connected with the source bus lines SL, while output terminals which output signals of the other polarity are not used. By this arrangement, it is also applicable to a scanned antenna (or to a display device in which line inversion driving is not carried out).

However, the present inventors conducted research and found that, in a scanned antenna or a display device in which line inversion driving is not carried out, when the source driver used has two types of output terminals which output signals of different polarities, there is a probability that a short circuit will occur between two types of output terminals adjoining each other. Possible reasons for this include, for example, an external substance coming into the gap between the pins of the adjoining output terminals, unintentional soldering of these pins, etc.

In a TFT module of the present embodiment, a sensing line is connected with an output terminal which is not connected with a source bus line SL, and an electric current in the sensing line is sensed. Thereby, the presence/absence of a short circuit between the output terminals can be easily detected.

Figure 16:
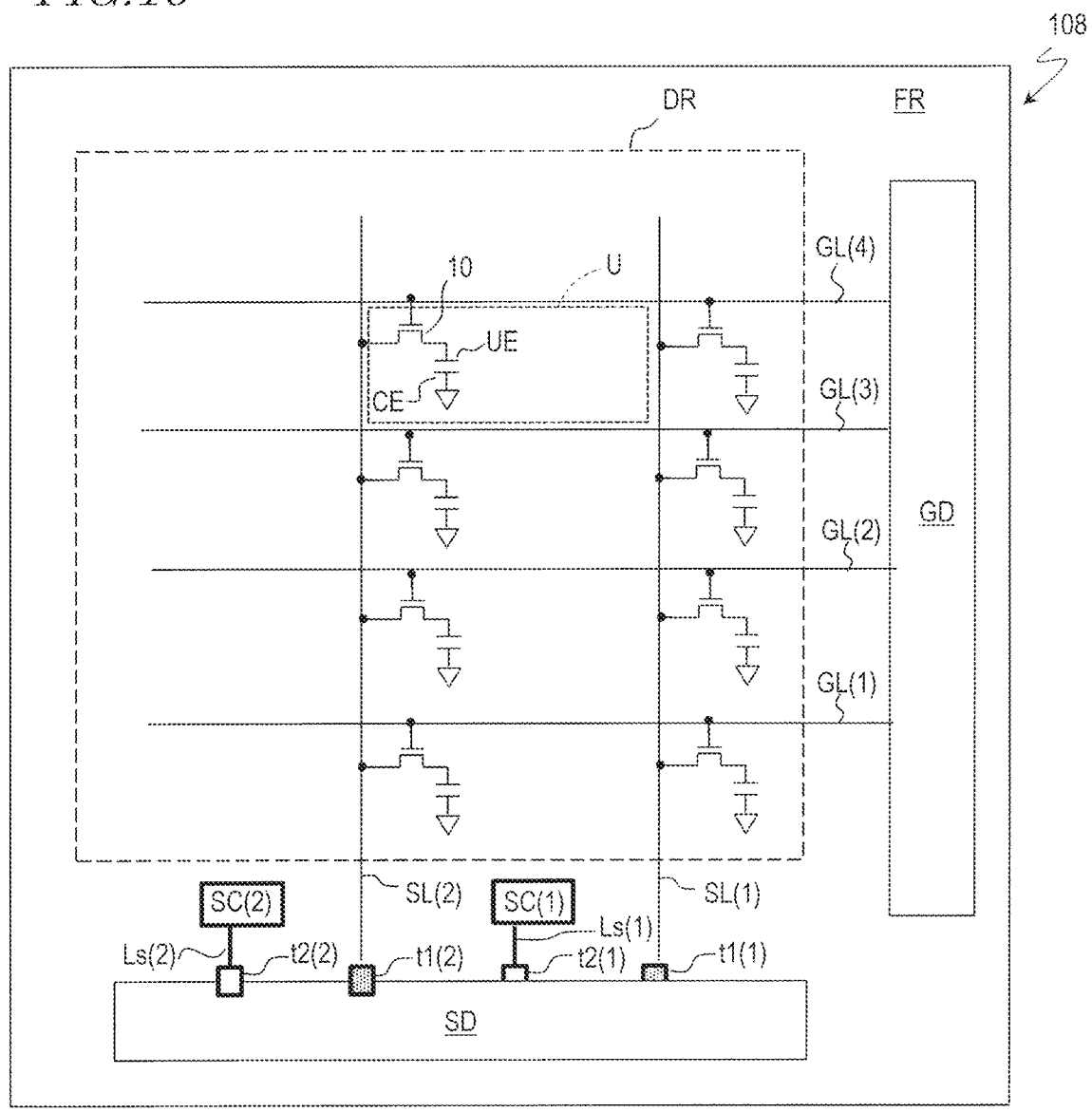
FIG. 16 is a plan view illustrating a TFT module 108 of the second embodiment.

FIG. 16 is a plan view illustrating a TFT module 108 of the second embodiment. Herein, only the differences from the TFT module 1000 are mainly described, and the description of features equivalent to those of the TFT module 1000 are appropriately omitted.

In the TFT module 108, the source driver SD includes a plurality of first output terminals t1 for outputting data signals of the first polarity (first data signals) and a plurality of second output terminals t2t for outputting data signals of the second polarity (second data signals). All or some of the plurality of first output terminals t1 are located adjacent to the second output terminals t2.

In this example, the first polarity is the positive polarity, and the second polarity is the negative polarity. The first output terminals t1 and the second output terminals t2 are alternately arranged. Note that the first and second polarities may be opposite. Also, the arrangement of the first output terminals t1 and the second output terminal t2 is not limited to the example illustrated in the drawing. For example, sets of N first output terminals t1 and sets of N second output terminals t2 may be alternately arranged.

Each of the plurality of source bus lines SL is connected with a corresponding one of the first output terminals t1 of the source driver SD. The source bus lines SL are not connected with the second output terminals t2.

In the second region R2, a plurality of sensing lines Lsense and a plurality of current sensing circuits SC are provided. The current sensing circuits SC are located near, for example, the source driver SD. Each of the sensing lines Lsense is connected with a corresponding one of the second output terminals t2 and with a corresponding one of the current sensing circuits SC.

In the example illustrated in the drawing, the sensing lines Lsense are connected with all of the second output terminals t2, although the sensing lines Lsense may be connected with only some of the second output terminals t2 (for example, terminals located adjacent to the first output terminals t1).

A manufacturing method of a device which includes the TFT module 108 (for example, scanned antenna) includes an inspection step for detecting the presence/absence of a short circuit.

Figure 17:
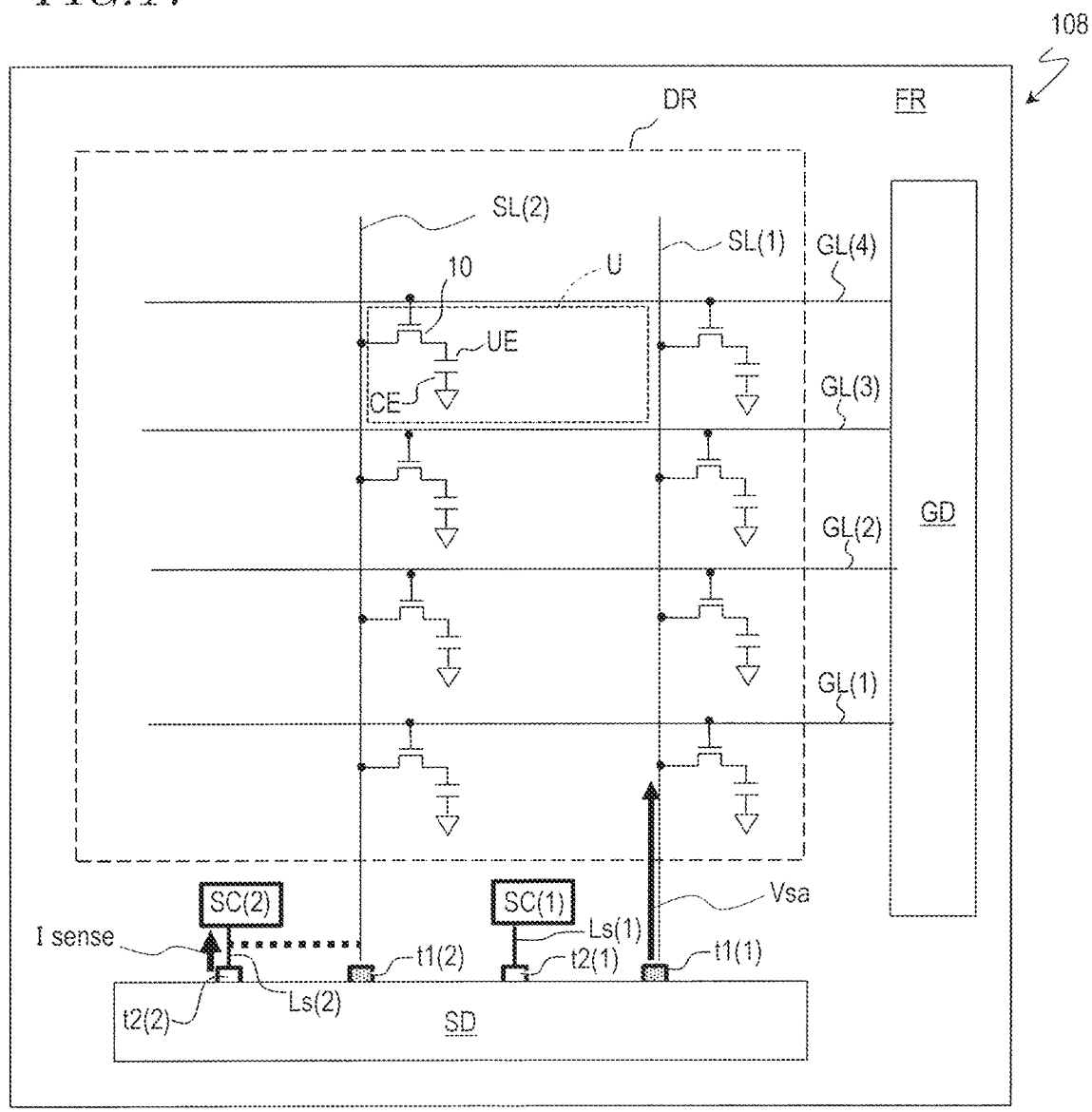
FIG. 17 is a plan view for illustrating an inspection method of the TFT module 108 of the second embodiment.

FIG. 17 is a plan view for illustrating the inspection step of the TFT module 108.

As shown in FIG. 17, data signals Vsa for inspection are supplied from the source driver SD to the source bus lines SL, and the respective electric currents Isense in the sensing lines Lsense are sensed by the current sensing circuits SC. Thereby, the presence/absence of a short circuit between the sensing lines Lsense and the source bus lines SL adjacent to the sensing lines Lsense is detected. When a sense current Isense (>0) is input to a current sensing circuit SC, a short circuit is detected between an output terminal t2(2) with which that sensing line Lsense (herein, sensing line Lsense (2)) is connected and the adjacent output terminal t1(2).

Then, short circuit detection information is produced which specifies the sensing line Lsense which is detected as having a short circuit. The short circuit detection information may be output or may be stored in a memory.

Thereafter, a repair process such as a rework of the source driver SD, a rework of wires, etc., is carried out based on the short circuit detection information.

According to the inspection method of the present embodiment, by analyzing the information from the source driver SD, the presence/absence and positions of abnormalities such as short circuits can be specified.

Therefore, it is possible to detect a defect which is difficult to find by visual perception. Also, it is possible to detect a defect more quickly than a method which is based on visual perception.

The present embodiment is broadly applicable to a TFT module and a device in which only either of the first output terminals and the second output terminals of the source driver SD are connected with the source bus lines SL. The present embodiment is also applicable not only to a scanned antenna but also to a display device in which line inversion driving or dot inversion driving is not carried out.

INDUSTRIAL APPLICABILITY

An embodiment of the present invention is broadly applicable to a device which includes a TFT module. For example, it is applicable to scanned antennas for satellite communication or satellite broadcasting which are built in vehicles or vessels (e.g., ships, airplanes, automobiles), display devices such as liquid crystal display devices, organic electroluminescence (EL) display devices, and inorganic electroluminescence display devices, imaging devices such as image sensor devices, and various electronic devices such as image input devices, fingerprint readers, and semiconductor memories.

REFERENCE SIGNS LIST

21: comparator
22-24: resistor
30: bidirectional buffer
31: three-state buffer
32: three-state buffer
40: current sensing portion
101-108: TFT module
800: scanned antenna
900: display device
FBL: feedback line
GD: gate driver
GL: gate bus line
SD: source driver
SL: source bus line
SC, SC_a, SC_b: current sensing circuit
LC: liquid crystal layer
R1: first region
R2: second region
U: unit region
UE: unit electrode
Vga: scan signal
Vgb: auxiliary scan signal
Vsa: data signal
Vsb: auxiliary data signal
d1, d2: wire breakage portion
e1, f1: first end
e2, f2: second end
p1, p2, q1, q2: peripheral portion
t1: first output terminal
t2: second output terminal

The invention claimed is:
1. A TFT module comprising:
a substrate;
a plurality of TFTs supported by the substrate;
a plurality of gate bus lines, each of the plurality of TFTs being connected with any one of the plurality of gate bus lines;
a plurality of source bus lines which intersect the plurality of gate bus lines when viewed in a normal direction of the substrate;
a plurality of unit electrodes each connected with a corresponding one of the plurality of source bus lines via a corresponding one of the plurality of TFTs; and
a gate driver configured to supply a scan signal from a first end of the plurality of gate bus lines and a source driver configured to supply a data signal from a first end of the plurality of source bus lines, the gate driver and the source driver being provided in a second region lying around a first region in which the plurality of unit electrodes are provided,
wherein the TFT module further comprises
a plurality of current sensing circuits provided in the second region, and
a plurality of feedback lines, and
each of the plurality of feedback lines is connected with a corresponding one of the plurality of current sensing circuits and with a second end of a corresponding one of the plurality of source bus lines or the plurality of gate bus lines, the second end being opposite to the first end.

2. The TFT module of claim 1, wherein each of the plurality of current sensing circuits includes an input/output terminal which includes a bidirectional buffer, the input/output terminal being connected with a corresponding one of the plurality of feedback lines.

3. The TFT module of claim 1, wherein each of the plurality of feedback lines is connected with the second end of a corresponding one of the plurality of source bus lines.

4. The TFT module of claim 3, wherein
each of the plurality of current sensing circuits is connected with the source driver, and
each of the plurality of current sensing circuits is configured such that the data signal is supplied from the source driver to a source bus line connected via a feedback line corresponding to that current sensing circuit and that, when no sense current flows through the corresponding feedback line, an auxiliary data signal from the source driver is output to the corresponding feedback line.

5. A method for driving a device which includes the TFT module as set forth in claim 3, the method comprising steps of:
in supplying the data signal from the source driver to each of the plurality of source bus lines, sensing a sense current flowing through each of the plurality of feedback lines, thereby detecting the presence/absence of a wire breakage in the plurality of source bus lines; and
in supplying the data signal to a breakage-detected source bus line which is detected as having a wire breakage, supplying an auxiliary data signal to a feedback line connected with the breakage-detected source bus line.

6. The TFT module of claim 1, wherein each of the plurality of feedback lines is connected with the second end of a corresponding one of the plurality of gate bus lines.

7. The TFT module of claim 6, wherein
each of the plurality of current sensing circuits is connected with the gate driver, and
each of the plurality of current sensing circuits is configured such that the scan signal is supplied from the gate driver to a gate bus line connected via a feedback line corresponding to that current sensing circuit and that, when no sense current flows through the corresponding feedback line, an auxiliary data signal from the gate driver is output to the corresponding feedback line.

8. A method for driving a device which includes the TFT module as set forth in claim 6, the method comprising steps of:
in supplying the scan signal from the gate driver to each of the plurality of gate bus lines, sensing a sense current flowing through each of the plurality of feedback lines, thereby detecting the presence/absence of a wire breakage in the plurality of gate bus lines; and
in supplying the scan signal to a breakage-detected gate bus line which is detected as having a wire breakage, supplying an auxiliary scan signal to a feedback line connected with the breakage-detected gate bus line.

9. The TFT module of claim 1, further comprising a memory in which breakage detection information is stored, the breakage detection information specifying a feedback line connected with a source bus line or gate bus line in which a wire breakage is detected beforehand.

10. A method for driving a device which includes the TFT module as set forth in claim 9, the method comprising steps of:
retrieving the breakage detection information from the memory; and
in supplying the data signal or the scan signal to the source bus line or gate bus line in which a wire breakage is detected beforehand based on the breakage detection information, supplying an auxiliary data signal or auxiliary scan signal to a feedback line connected with the source bus line or gate bus line.

11. The TFT module of claim 1, wherein each of the plurality of feedback lines extends across the first region.

12. The TFT module of claim 1, wherein each of the plurality of feedback lines is provided only in the second region.

13. A method for manufacturing a device which includes the TFT module as set forth in claim 12, the method comprising steps of:
supplying the first data signal from the source driver to the plurality of source bus lines and sensing an electric current in each of the plurality of sensing lines, thereby detecting the presence/absence of a short circuit between the plurality of sensing lines and the plurality of source bus lines; and
if the presence of a short circuit is detected, producing a signal which specifies a sensing line in which the presence of a short circuit is detected.

14. The TFT module of claim 1, wherein the plurality of unit electrodes are concentrically arranged.

15. The TFT module of claim 1, wherein the plurality of unit electrodes are metal electrodes.

16. A scanned antenna comprising:
the TFT module as set forth in claim 1;
a slot substrate arranged so as to oppose the substrate;
a liquid crystal layer provided between the substrate and the slot substrate; and
an electrically-conductive reflector arranged so as to oppose a surface of the slot substrate opposite to the liquid crystal layer via a dielectric layer,
wherein the slot substrate includes a dielectric substrate and a slot electrode provided on a surface of the dielectric substrate on the liquid crystal layer side, and
the slot electrode has a plurality of slots, the plurality of slots being arranged so as to correspond to the plurality of unit electrodes of the TFT module.

17. A method for manufacturing a device which includes the TFT module as set forth in claim 1, the method comprising steps of:
supplying a signal for inspection to each of the plurality of source bus lines or the plurality of gate bus lines and sensing an electric current in each of the plurality of feedback lines, thereby detecting the presence/absence of a wire breakage in the plurality of source bus lines or the plurality of gate bus lines;
producing breakage detection information which specifies a feedback line connected with a source bus line or gate bus line which is detected as having a wire breakage; and
storing the breakage detection information in a memory.

18. The method of claim 17, wherein the device is a scanned antenna.

19. A TFT module comprising:
a substrate;
a plurality of TFTs supported by the substrate;
a plurality of gate bus lines, each of the plurality of TFTs being connected with any one of the plurality of gate bus lines;
a plurality of source bus lines which intersect the plurality of gate bus lines when viewed in a normal direction of the substrate; and
a plurality of unit electrodes each connected with a corresponding one of the plurality of source bus lines via a corresponding one of the plurality of TFTs,
wherein in a second region lying around a first region in which the plurality of unit electrodes are provided, the plurality of gate bus lines have a first end to which a scan signal is supplied from a gate driver, and the plurality of source bus lines have a first end to which a data signal is supplied from a source driver,
the TFT module further comprises
a plurality of inspection terminals provided in the second region, and
a plurality of feedback lines, and
each of the plurality of feedback lines is connected with a corresponding one of the plurality of inspection terminals and with a second end of a corresponding one of the plurality of source bus lines or the plurality of gate bus lines, the second end being opposite to the first end.

20. A TFT module comprising:
a substrate;
a plurality of TFTs supported by the substrate;
a plurality of gate bus lines, each of the plurality of TFTs being connected with any one of the plurality of gate bus lines;
a plurality of source bus lines which intersect the plurality of gate bus lines when viewed in a normal direction of the substrate;
a plurality of unit electrodes each connected with a corresponding one of the plurality of source bus lines via a corresponding one of the plurality of TFTs; and
a gate driver configured to supply a scan signal from a first end of the plurality of gate bus lines and a source driver configured to supply a data signal from a first end of the plurality of source bus lines, the gate driver and the source driver being provided in a second region lying around a first region in which the plurality of unit electrodes are provided,
wherein the source driver has a plurality of output terminals, the plurality of output terminals including a plurality of first output terminals for outputting a first data signal of a first polarity and a plurality of second output terminals for outputting a second data signal of a second polarity, each of the plurality of first output terminals being arranged adjacent to any of the plurality of second output terminals,
each of the plurality of source bus lines is electrically coupled with a corresponding one of the plurality of first output terminals,
the TFT module further comprises
a plurality of current sensing circuits provided in the second region, and
a plurality of sensing lines, and
each of the plurality of sensing lines is connected with a corresponding one of the plurality of second output terminals and with a corresponding one of the plurality of current sensing circuits.

* * * * *